(12) United States Patent
Park et al.

(10) Patent No.: US 11,495,615 B2
(45) Date of Patent: Nov. 8, 2022

(54) THREE-DIMENSIONAL SEMICONDUCTOR MEMORY DEVICE

(71) Applicant: Samsung Electronics Co., Ltd., Suwon-si (KR)

(72) Inventors: Kyungeun Park, Gwangju (KR); Jae-Joo Shim, Suwon-si (KR); Dongsung Woo, Suwon-si (KR); Jongkwang Lim, Suwon-si (KR); Jaehoon Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 236 days.

(21) Appl. No.: 17/009,075

(22) Filed: Sep. 1, 2020

(65) Prior Publication Data

US 2021/0225868 A1    Jul. 22, 2021

(30) Foreign Application Priority Data

Jan. 17, 2020    (KR) .................. 10-2020-0006638

(51) Int. Cl.
*H01L 27/11582*    (2017.01)
*H01L 27/11556*    (2017.01)
*H01L 27/11573*    (2017.01)
*G11C 7/18*    (2006.01)
*H01L 27/11519*    (2017.01)
(Continued)

(52) U.S. Cl.
CPC .......... *H01L 27/11582* (2013.01); *G11C 7/18* (2013.01); *H01L 27/11519* (2013.01); *H01L 27/11539* (2013.01); *H01L 27/11556* (2013.01); *H01L 27/11565* (2013.01); *H01L 27/11573* (2013.01)

(58) Field of Classification Search
CPC ................................. H01L 27/11582
See application file for complete search history.

(56) References Cited

U.S. PATENT DOCUMENTS 9,362,306 B2    6/2016    Park et al.
9,406,692 B2    8/2016    Lee
9,455,263 B2    9/2016    Zhang et al.
(Continued)

FOREIGN PATENT DOCUMENTS

KR    10-2015-0133914 A    12/2015
KR    10-2016-0020019 A    2/2016
KR    10-2020-0055186 A    5/2020

*Primary Examiner* — Christopher A Johnson
(74) *Attorney, Agent, or Firm* — Harness, Dickey & Pierce, P.L.C.

(57) ABSTRACT

Disclosed is a three-dimensional semiconductor memory device comprising a substrate including a cell region and a connection region, a plurality of inter-electrode dielectric layers and a plurality of electrode layers alternately stacked on the substrate, wherein ends of the plurality of electrode layers form a stepwise shape on the connection region, a planarized dielectric layer on the connection region and covering the ends of the plurality of electrode layers, and a first abnormal dummy vertical pattern on the connection region and penetrating the planarized dielectric layer in a first direction perpendicular to a top surface of the substrate. At least one of the plurality of electrode layers is positioned between the first abnormal dummy vertical pattern and the substrate and is insulated from the first abnormal dummy vertical pattern.

20 Claims, 27 Drawing Sheets

(51) Int. Cl.
*H01L 27/11539* (2017.01)
*H01L 27/11565* (2017.01)

(56) References Cited

U.S. PATENT DOCUMENTS

| | | |
|---|---|---|
| 9,536,897 B2 | 1/2017 | Yoo et al. |
| 9,887,207 B2 | 2/2018 | Zhang et al. |
| 9,978,766 B1 | 5/2018 | Hosoda et al. |
| 10,256,245 B2 | 4/2019 | Ariyoshi |
| 2012/0061744 A1 | 3/2012 | Hwang et al. |
| 2017/0236746 A1 | 8/2017 | Yu et al. |
| 2018/0151672 A1 | 5/2018 | Choi et al. |
| 2018/0240811 A1 | 8/2018 | Kim et al. |
| 2018/0294225 A1* | 10/2018 | Lee .................. H01L 27/11582 |
| 2020/0152654 A1 | 5/2020 | Hwang et al. |

\* cited by examiner

THREE-DIMENSIONAL SEMICONDUCTOR MEMORY DEVICE

CROSS-REFERENCE TO RELATED APPLICATION

This U.S. nonprovisional application claims priority under 35 U.S.C. § 119 to Korean Patent Application No. 10-2020-0006638 filed on Jan. 17, 2020 in the Korean Intellectual Property Office, the disclosure of which is hereby incorporated by reference in its entirety.

BACKGROUND

The present inventive concepts relate to a three-dimensional semiconductor memory device, and more particularly, to a three-dimensional semiconductor memory device with increased reliability.

Semiconductor devices have been highly integrated to meet higher performance and/or lower manufacturing cost which are required by customers. Because integration of the semiconductor devices is a factor in determining product price, high integration is increasingly requested. Integration of typical two-dimensional or planar semiconductor devices is primarily determined by the area occupied by a unit memory cell, such that it is influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with increased reliability.

An advantage of the present inventive concepts is not limited to the mentioned above, and other advantages which have not been mentioned above will be clearly understood to those skilled in the art from the following description.

According to some example embodiments of the present inventive concepts, a three-dimensional semiconductor memory device may comprise: a substrate including a cell region and a connection region; a plurality of inter-electrode dielectric layers and a plurality of electrode layers alternately stacked on the substrate, ends of the plurality of electrode layers forming a stepwise shape on the connection region; a planarized dielectric layer on the connection region, the planarized dielectric layer covering the ends of the plurality of electrode layers; and a first abnormal dummy vertical pattern on the connection region, the first abnormal dummy vertical pattern penetrating the planarized dielectric layer in a first direction perpendicular to a top surface of the substrate. At least one of the plurality of electrode layers may be positioned between the first abnormal dummy vertical pattern and the substrate and may be insulated from the first abnormal dummy vertical pattern.

According to some example embodiments of the present inventive concepts, a three-dimensional semiconductor memory device may comprise: a substrate including a cell region and a connection region; a first stack structure including a plurality of first inter-electrode dielectric layers and a plurality of first electrode layers alternately stacked on the substrate; a second stack structure including a plurality of second inter-electrode dielectric layers and a plurality of second electrode layers alternately stacked on the first stack structure; a cell vertical pattern on the cell region, the cell vertical pattern penetrating the first and second stack structures in a first direction perpendicular to a top surface of the substrate; and an abnormal dummy vertical pattern on the connection region, the abnormal dummy vertical pattern penetrating one or more of the plurality of second electrode layers. A sidewall of the cell vertical pattern may have an inflection point adjacent to a boundary between the first stack structure and the second stack structure. At least one of the plurality of first electrode layers may be interposed in the first direction between the abnormal dummy vertical pattern and the substrate.

According to some example embodiments of the present inventive concepts, a three-dimensional semiconductor memory device may comprise: a peripheral circuit structure including a transistor and a peripheral wiring line; and a cell array structure on the peripheral circuit structure. The cell array structure may include: a first substrate including a cell region and a connection region; a first stack structure including a plurality of first inter-electrode dielectric layers and a plurality of first electrode layers alternately stacked on the first substrate; a second stack structure including a plurality of second inter-electrode dielectric layers and a plurality of second electrode layers alternately stacked on the first stack structure; an abnormal dummy vertical pattern on the connection region, the abnormal dummy vertical pattern penetrating one or more of the second plurality of electrode layers in a first direction perpendicular to a top surface of the substrate; and a sacrificial buried pattern in the first stack structure on the connection region, the sacrificial buried pattern being spaced apart from the abnormal dummy vertical pattern.

BRIEF DESCRIPTION OF THE DRAWINGS

FIGS. 5A to 9A illustrate cross-sectional views showing a method of fabricating a three-dimensional semiconductor memory device having the cross-section of FIG. 3A according to some example embodiments of the present inventive concepts.

FIGS. 5B to 9B illustrate cross-sectional views showing a method of fabricating a three-dimensional semiconductor memory device having the cross-section of FIG. 3B according to some example embodiments of the present inventive concepts.

DETAILED DESCRIPTION OF EXAMPLE EMBODIMENTS

Some example embodiments of the present inventive concepts will now be described in detail with reference to the accompanying drawings to aid in clearly explaining the present inventive concepts.

Figure 1A:
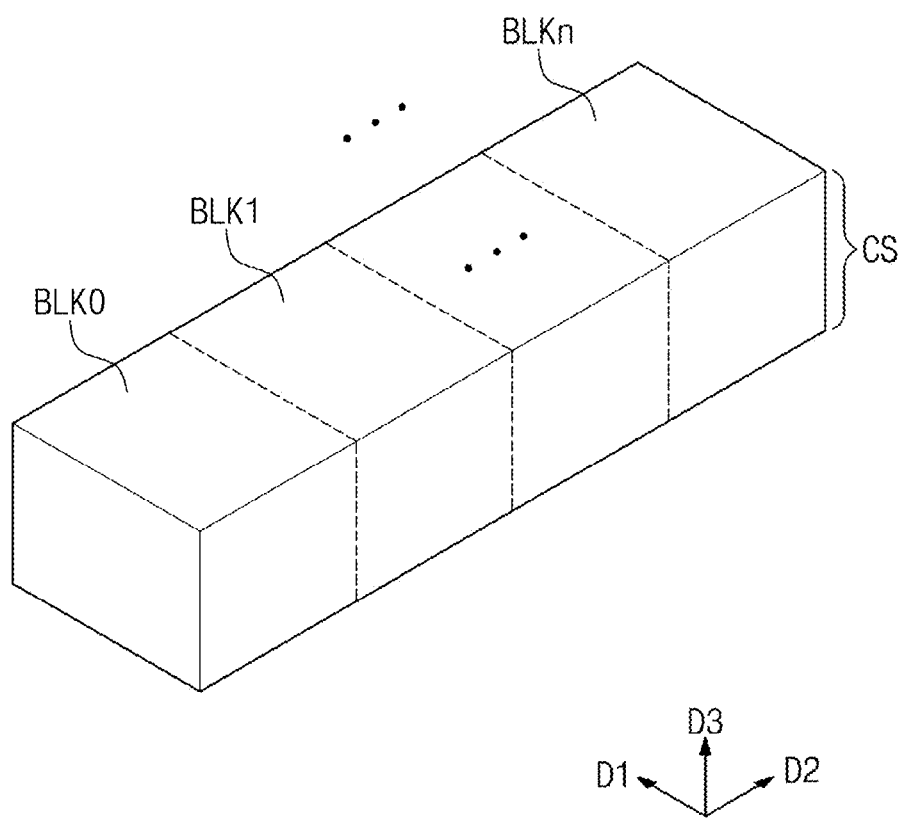
FIG. 1A illustrates a block diagram showing a three-dimensional semiconductor memory device according to some example embodiments of the present inventive concepts.

FIG. 1A illustrates a block diagram showing a three-dimensional semiconductor memory device according to some example embodiments of the present inventive concepts.

Referring to FIG. 1A, a three-dimensional semiconductor memory device according to some example embodiments of the present inventive concepts may include a cell array structure CS disposed on a substrate. The cell array structure CS may include a plurality of memory blocks BLK0 to BLKn each of which is a data erasure unit. Each of the memory blocks BLK0 to BLKn may include a memory cell array having a three-dimensional structure (or vertical structure).

Figure 1B:
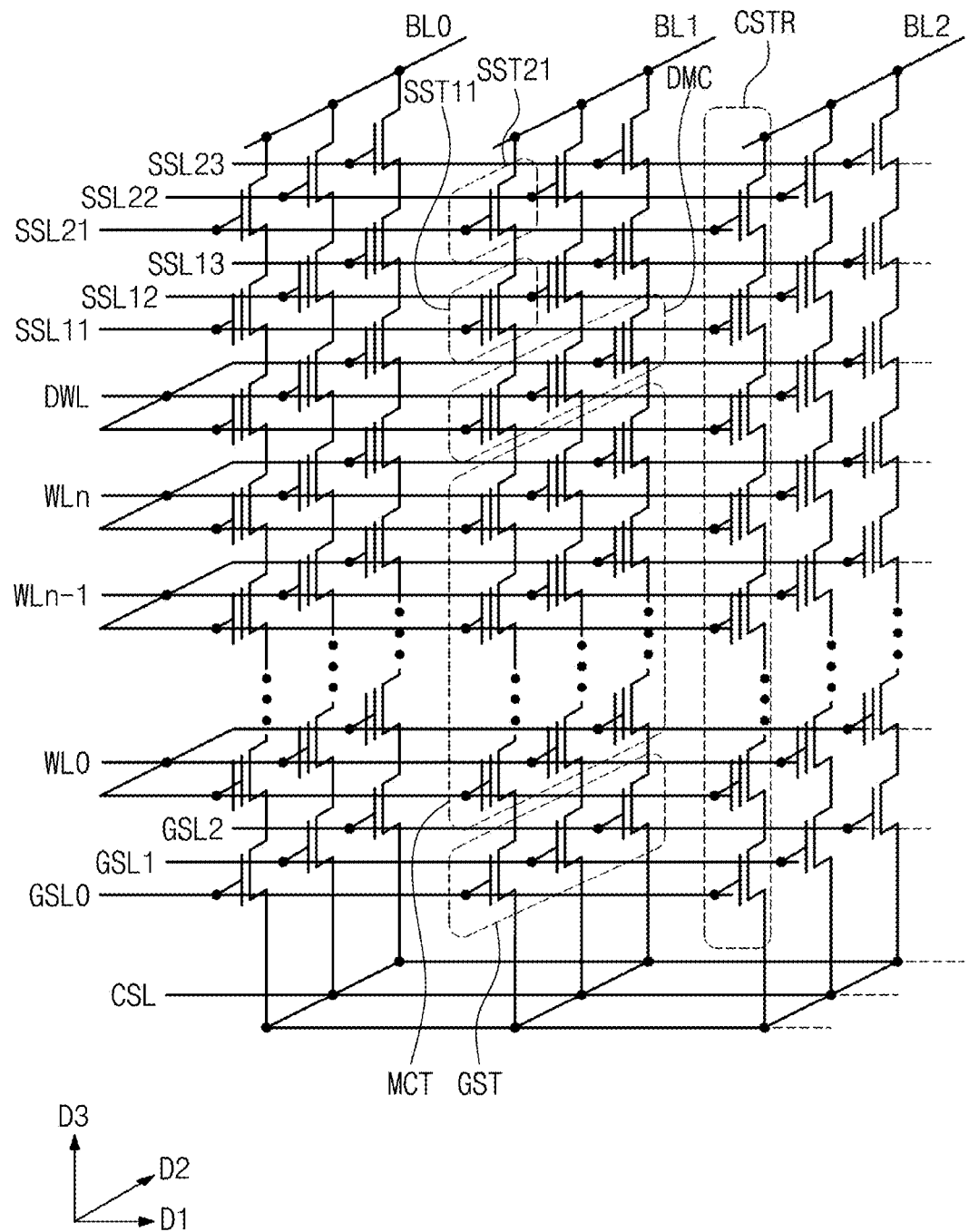
FIG. 1B illustrates a circuit diagram showing a three-dimensional semiconductor memory device according to some example embodiments of the present inventive concepts.

FIG. 1B illustrates a circuit diagram showing a three-dimensional semiconductor memory device according to some example embodiments of the present inventive concepts.

Referring to FIG. 1B, each of the memory blocks BLK0 to BLKn may be configured such that cell strings CSTR are two-dimensionally arranged along first and second directions D1 and D2 and are elongated along a third direction D3. A plurality of cell strings CSTR may be connected in parallel to each of bit lines BL0 to BL2. A plurality of cell strings CSTR may be connected in common to a common source line CSL.

The bit lines BL0 to BL2 may be two-dimensionally arranged, and a plurality of cell strings CSTR may be connected in parallel to each of the bit lines BL0 to BL2. A plurality of cell strings CSTR may be connected in common to the common source line CSL. For example, a plurality of cell strings CSTR may be disposed between a plurality of bit lines BL0 to BL2 and one common source line CSL. The common source line CSL may be provided in plural arranged two-dimensionally. The common source lines CSL may be supplied with the same voltage or may be electrically controlled independently of each other.

In some example embodiments, one of the cell strings CSTR may include string selection transistors SST21 and/or SST11 connected in series, memory cell transistors MCT connected in series, and/or a ground selection transistor GST. Each of the memory cell transistors MCT may include a data storage element. One of the cell strings CSTR may further include dummy cells DMC between the string selection transistor SST11 and the memory cell transistor MCT and between the ground selection transistor GST and the memory cell transistor MCT. Other cell strings CSTR may have an identical or similar structure to that discussed above.

The string selection transistor SST21 may be coupled to a first bit line BL1, and the ground selection transistor GST may be coupled to the common source line CSL. The memory cell transistors MCT connected to one cell string CSTR may be connected in series between, for example, the string selection transistor SST11 and the ground selection transistor GST.

Alternatively, in each of the cell strings CSTR, the ground selection transistor GST may include a plurality of MOS transistors connected in series similar to the string selection transistors SST21 and SST11. Dissimilarly, each of the cell strings CSTR may include one string selection transistor.

In some example embodiments, the string selection transistor SST11 may be controlled by a string selection line SSL11, and the string selection transistor SST21 may be controlled by a string selection line SSL21. The memory cell transistors MCT may be controlled by a plurality of word lines WL0 to WLn, and the dummy cells DMC may be controlled by a dummy word line DWL. The ground selection transistor GST may be controlled by a ground selection line GSL. The common source line CSL may be connected in common to sources of the ground selection transistors GST.

One cell string CSTR may include a plurality of memory cell transistors MCT at different distances from the common source line CSL. A plurality of word lines WL0 to WLn and DWL may be disposed between the common source lines CSL and the bit lines BL0 to BL2.

The memory cell transistors MCT may include gate electrodes at the same or substantially the same distance from the common source line CSL, and the gate electrodes may be connected in common to one of the word lines WL0 to WLn and DWL, thereby being in an equipotential state. Alternatively, although the gate electrodes of the memory cell transistors MCT are disposed at the same or substantially the same distance from the common source line CSL, the gate electrodes disposed at different rows or columns may be controlled independently of each other.

Figure 2:
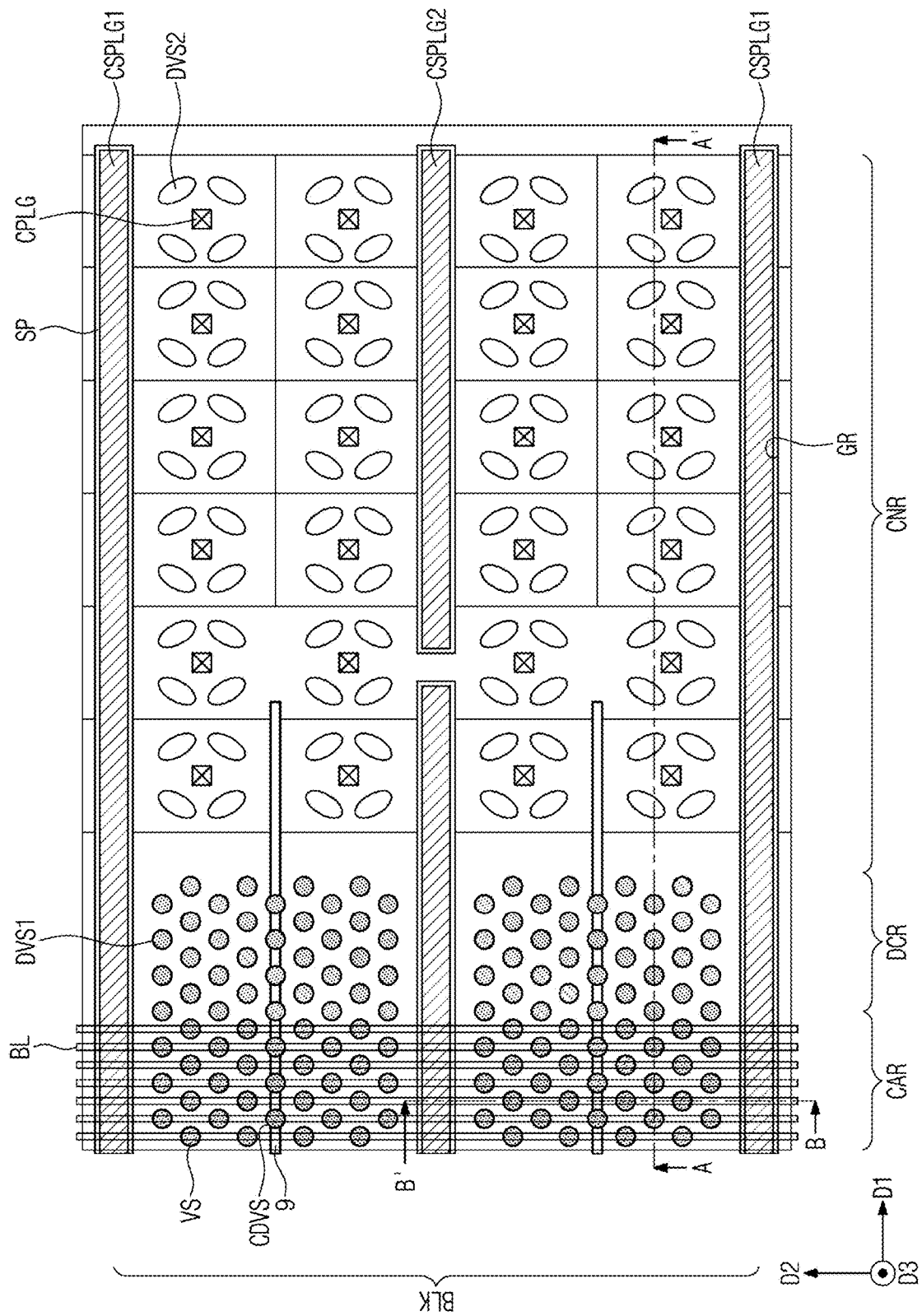
FIG. 2 illustrates a plan view showing a three-dimensional semiconductor memory device according to some example embodiments of the present inventive concepts.
Figure 3A:
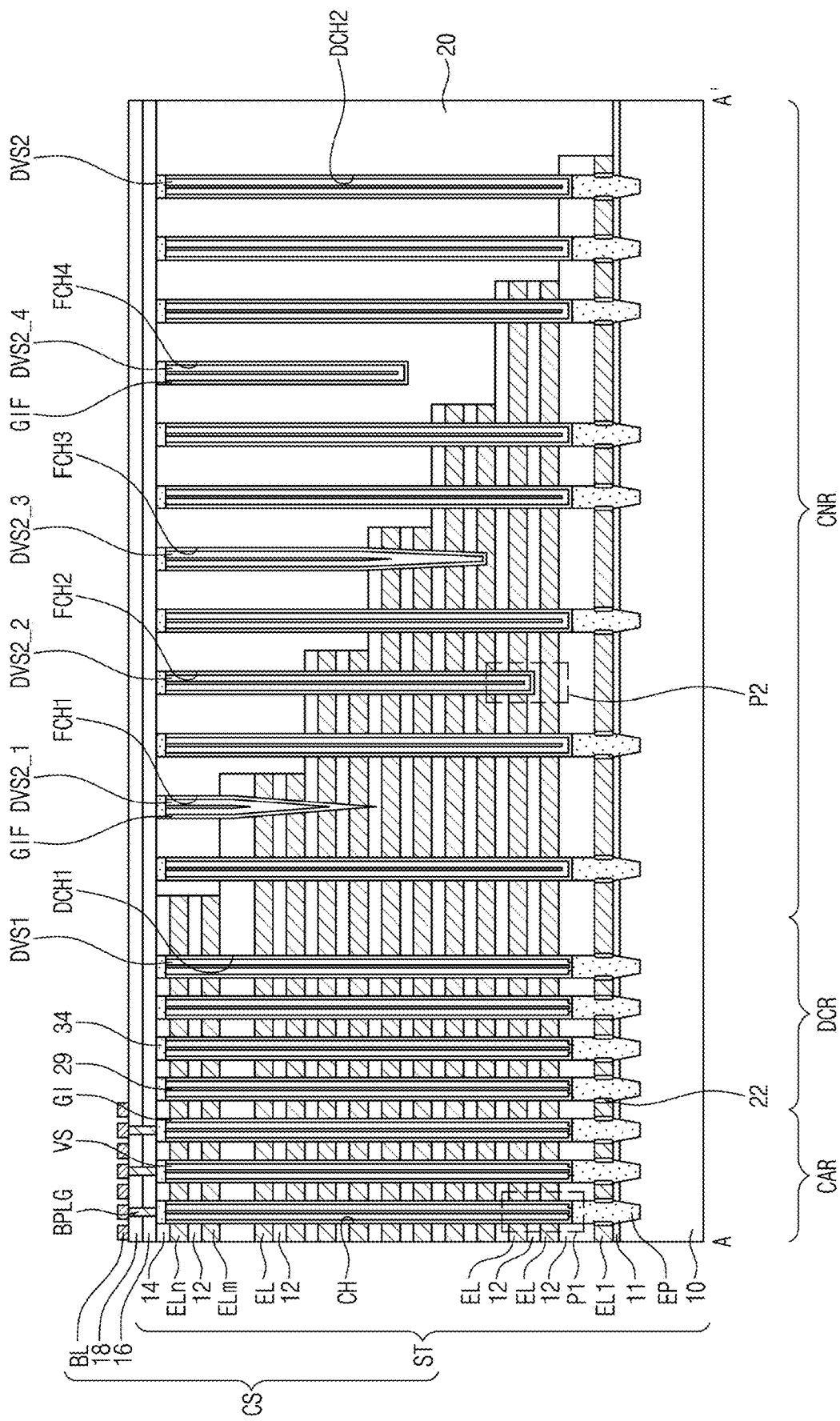
FIG. 3A illustrates a cross-sectional view taken along line A-A' of FIG. 2.
Figure 3B:
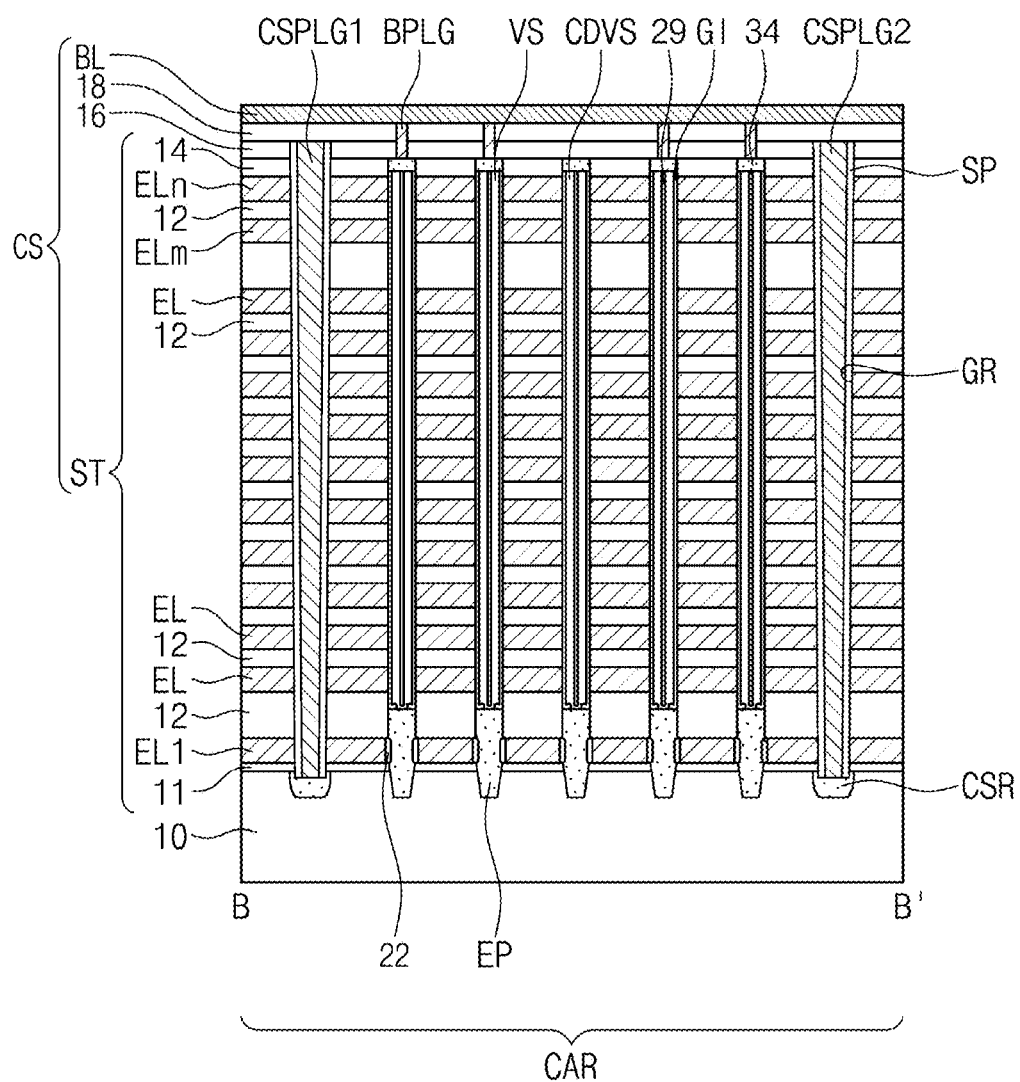
FIG. 3B illustrates a cross-sectional view taken along line B-B' of FIG. 2.
Figure 4A:
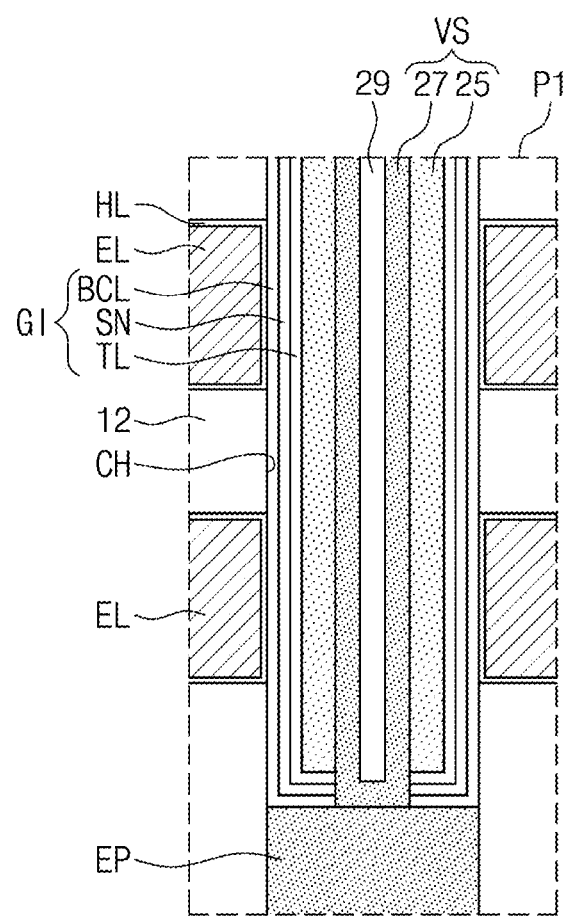
FIG. 4A illustrates an enlarged view showing section P1 of FIG. 3A.
Figure 4B:
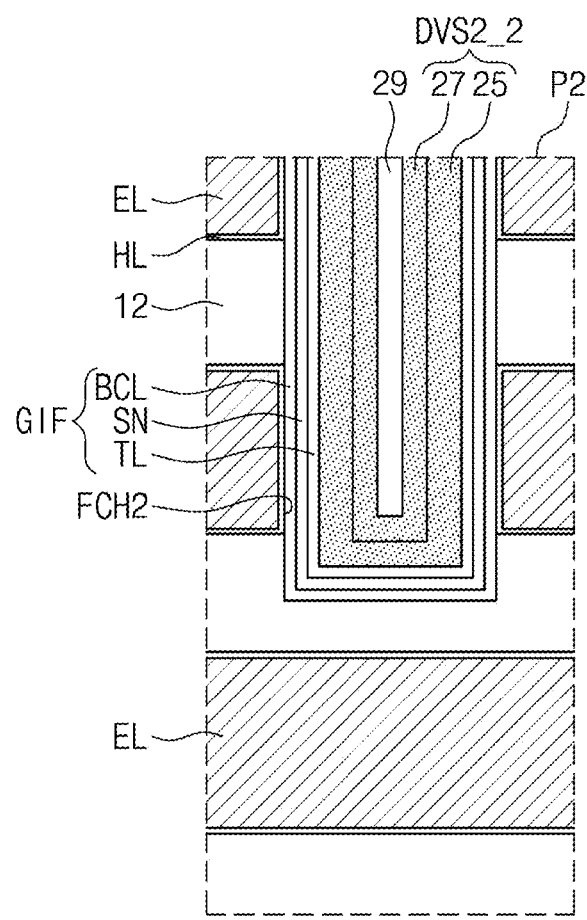
FIG. 4B illustrates an enlarged view showing section P3 of FIG. 3A.

FIG. 2 illustrates a plan view showing a three-dimensional semiconductor memory device according to some example embodiments of the present inventive concepts. FIG. 3A illustrates a cross-sectional view taken along line A-A' of FIG. 2. FIG. 3B illustrates a cross-sectional view taken along line B-B' of FIG. 2. FIG. 4A illustrates an enlarged view showing section P1 of FIG. 3A. FIG. 4B illustrates an enlarged view showing section P2 of FIG. 3A.

Referring to FIGS. 2, 3A, 3B, 4A, and 4B, a cell array structure CS may be disposed on a substrate 10. The cell array structure CS may include a plurality of memory blocks BLK0 to BLKn, and FIG. 2 shows a plan view of one memory block BLK selected from the plurality of memory blocks BLK0 to BLKn. The substrate 10 may be formed of one of a semiconductor material (e.g., silicon wafer), a dielectric material (e.g., glass), and a conductor or semiconductor covered with a dielectric material. The substrate 10 may be doped with impurities, for example, having a first conductivity type. The substrate 10 may include a cell region CAR, a dummy cell region DCR, and/or a connection region CNR that are arranged in a first direction D1. A buffer dielectric layer 11 may be disposed on the substrate 10. The buffer dielectric layer 11 may have a single-layered or multi-layered structure including, for example, one or more of a silicon oxide layer, a silicon nitride layer, and a silicon oxynitride layer.

The buffer dielectric layer 11 may be provided thereon with electrode layers EL1, EL, ELm, and ELn and inter-electrode dielectric layers 12 that are alternately stacked. The electrode layers EL1, EL, ELm, and ELn may include a first electrode layer EL1 closest to the substrate 10, an $n^{th}$ electrode layer ELn farthest away from the substrate 10, an $m^{th}$ electrode layer ELm adjacent to the $n^{th}$ electrode layer ELn, and a plurality of middle electrode layers EL between the first electrode layer EL1 and the $m^{th}$ electrode layer ELm. The $n^{th}$ electrode layer ELn may be covered with a capping dielectric layer 14.

The capping dielectric layer 14 may include the same material as that of the inter-electrode dielectric layer 12. The inter-electrode dielectric layer 12 may include, for example, a silicon oxide layer. The electrode layers EL1, EL, ELm, and ELn may contain metal, for example, tungsten. The buffer dielectric layer 11, the inter-electrode dielectric layers 12, the electrode layers EL1, EL, ELm, and ELn, and/or the capping dielectric layer 14 may constitute a stack structure ST.

The electrode layers EL1, EL, ELm, and ELn may have ends (or pad portions) that form a stepwise structure on the connection region CNR. For example, the electrode layers EL1, EL, ELm, and ELn may have lengths in the first direction D1 that decrease with increasing distance from the substrate 10, and the stack structure ST may have a height that decreases with increasing distance from the cell region CAR. On the connection region CNR, the electrode layers EL1, EL, ELm, and ELn may have sidewalls that are equally spaced apart from each other along the first direction D1. Each of the electrode layers EL1, EL, ELm, and ELn may have a pad portion on the connection region CNR, and the pad portions of the electrode layers EL1, EL, ELm, and ELn may be horizontally and vertically located at different positions. The $n^{th}$ and $m^{th}$ electrode layers ELn and ELm of the electrode layers EL1, EL, ELm, and ELn may each have a linear shape that extends in the first direction D1, and may be spaced apart from each other across a separation dielectric pattern 9.

In some example embodiments, a NAND Flash memory device may be adopted as a three-dimensional semiconductor memory device according to the present inventive concepts. For example, the first electrode layer EL1 may correspond to the ground selection lines GSL0 to GSL2 of FIG. 1B. The $m^{th}$ electrode layer ELm may correspond to the string selection lines SSL11, SSL12, and SSL13 of FIG. 1B. The $n^{th}$ electrode layer ELn may correspond to the string selection lines SSL21, SSL22, and SSL23 of FIG. 1B. The middle electrode layers EL may correspond to the word lines WL0 to WLn and the dummy word line DWL of FIG. 1B. On the connection region CNR, the stack structure ST may have an end covered with a planarized dielectric layer 20. The planarized dielectric layer 20 may include the same dielectric material as that of the inter-electrode dielectric layer 12. The planarized dielectric layer 20 may have a top surface coplanar with that of the capping dielectric layer 14.

On the cell region CAR, the stack structure ST may include a plurality of vertical holes CH that expose the substrate 10 and are spaced apart from each other. On the dummy cell region DCR, the stack structure ST may include a plurality of first dummy vertical holes DCH1 that expose the substrate 10 and are spaced apart from each other. On the connection region CNR, the stack structure ST may include a plurality of second dummy vertical holes DCH2 that expose the substrate 10 and are spaced apart from each other. On the connection region CNR, the second dummy vertical holes DCH2 may extend into the planarized dielectric layer 20. The vertical holes CH, the first dummy vertical holes DCH1, and the second dummy vertical holes DCH2 may have therein corresponding semiconductor patterns EP in contact with the substrate 10. The semiconductor patterns EP may be, for example, single-crystalline silicon patterns. The semiconductor patterns EP may be doped with impurities having the first conductivity type.

A ground gate dielectric layer 22 may be interposed between the first electrode layer EL1 and the semiconductor pattern EP. The ground gate dielectric layer 22 may include, for example, a silicon oxide layer. The ground gate dielectric layer 22 may not extend onto the middle electrode layers EL.

The vertical holes CH may have therein corresponding cell vertical patterns VS in contact with the semiconductor patterns EP. The first dummy vertical holes DCH1 may have therein corresponding first dummy vertical patterns DVS1 in contact with the semiconductor patterns EP. The second dummy vertical holes DCH2 may have therein corresponding second dummy vertical patterns DVS2 in contact with the semiconductor patterns EP. The cell vertical patterns VS, the first dummy vertical patterns DVS1, and/or the second dummy vertical patterns DVS2 may include, for example, a polysilicon layer or a single-crystalline silicon layer doped with either impurities or no impurities. The cell vertical patterns VS, the first dummy vertical patterns DVS1, and/or the second dummy vertical patterns DVS2 may each have a hollow cup shape. The first dummy vertical patterns DVS1 and/or the cell vertical patterns VS may each have a circular shape when viewed in plan. The first dummy vertical patterns DVS1 and the cell vertical patterns VS may have the same diameter (or maximum width). The second dummy vertical patterns DVS2 may each have an oval or circular shape when viewed in plan. As shown in the cross-section of FIG. 3A, the second dummy vertical patterns DVS2 may each have a width parallel to the first direction D1 the same as or greater than a width parallel to the first direction D1 of each of the cell vertical patterns VS.

As shown in FIG. 2, the cell region CAR may include a plurality of cell vertical patterns VS and/or a plurality of central dummy vertical patterns CDVS. The central dummy vertical patterns CDVS may be linearly disposed along the first direction D1 on a central portion of one section of the memory block BLK. The separation dielectric pattern 9 may be disposed between upper portions of the central dummy vertical patterns CDVS. The separation dielectric pattern 9 may include, for example, a silicon oxide layer.

Referring to FIG. 2, when viewed in plan, the second dummy vertical patterns DVS2 may penetrate the ends (or the pad portions) of the electrode layers EL1, EL, ELm, and ELn. The number of the electrode layers EL1, EL, ELm, and ELm that the second dummy vertical patterns DVS2 penetrate may progressively decrease as the second dummy vertical patterns DVS2 are further away from the cell region CAR. When viewed in plan, one cell contact plug CPLG may be surrounded by four second dummy vertical patterns DVS2 that are adjacent to each other and disposed to penetrate corresponding pad portions. For another example, when viewed in plan, one or more of the second dummy vertical patterns DVS2 may penetrate boundaries between adjacent ones of the electrode layers EL1, EL, ELm, and ELn. In some example embodiments, the second dummy vertical patterns DVS2 may be variously changed in arrangement. The cell contact plugs CPLG may penetrate the planarized dielectric layer 20 and/or first and second interlayer dielectric layers 16 and 18 which will be discussed below, thereby being coupled to corresponding pad portions of the electrode layers EL1, EL, ELm, and ELn.

Bit-line conductive pads 34 may be formed on top ends of the cell vertical patterns VS, top end of the central dummy vertical patterns CDVS, and top ends of the first and second dummy vertical patterns DVS1 and DVS2. The bit-line conductive pads 34 may be impurity-doped regions or may be formed of a conductive material. The bit-line conductive pads 34 on the cell vertical patterns VS may be connected to bit lines BL. On the other hand, the bit-line conductive pads 34 on the central dummy vertical patterns CDVS and the first and second dummy vertical patterns DVS1 and DVS2 may not be connected to the bit lines BL. The cell vertical patterns VS, the central dummy vertical patterns CDVS, the first dummy vertical patterns DVS1, and/or the second dummy vertical patterns DVS2 may each include a channel spacer layer 25 and/or a channel connection layer 27, as shown in FIG. 4A. The channel spacer layer 25 and/or the channel connection layer 27 may be formed of a polysilicon layer or a single-crystalline silicon layer doped with impurities.

First gate dielectric layers GI may be correspondingly interposed between the cell vertical patterns VS and inner walls of the vertical holes CH, between the first dummy vertical patterns DVS1 and inner walls of the first dummy vertical holes DCH1, and between the second dummy vertical patterns DVS2 and inner walls of the second dummy vertical holes DCH2. The first gate dielectric layers GI may each include a tunnel dielectric layer TL, a charge storage layer SN, and/or a blocking dielectric layer BCL, as shown in FIG. 4A. The charge storage layer SN may be a trap dielectric layer, a floating gate electrode, or a dielectric layer including conductive nano-dots. For example, the charge storage layer SN may include one or more of a silicon nitride layer, a silicon oxynitride layer, a silicon-rich nitride layer, a nano-crystalline silicon layer, and a laminated trap layer. The tunnel dielectric layer TL may include one of materials whose band gap is greater than that of the charge storage layer SN, and the blocking dielectric layer BCL may include a high-k dielectric layer such as an aluminum oxide layer or a hafnium oxide layer.

The first gate dielectric layers GI may partially cover corresponding top surfaces of the semiconductor patterns EP. The cell vertical pattern VS, the first dummy vertical pattern DVS1, and/or the second dummy vertical pattern DVS2 may each penetrate the first gate dielectric layer GI and contact the semiconductor pattern EP. For example, as shown in FIG. 4A, the channel connection layer 27 of each of the cell vertical pattern VS, the first dummy vertical pattern DVS1, and/or the second dummy vertical pattern DVS2 may penetrate the first gate dielectric layer GI and contact the semiconductor pattern EP. The channel connection layer 27 may have a hollow cup shape, and a buried dielectric pattern 29 may fill an empty space inside the channel connection layer 27. The buried dielectric pattern 29 may include, for example, a silicon oxide layer.

High-k dielectric layers HL may be interposed between the first gate dielectric layer GI and the electrode layers EL1, EL, ELm, and ELn and between the inter-electrode dielectric layers 12. The high-k dielectric layer HL may be a layer, such as an aluminum oxide layer or a hafnium oxide layer, having a dielectric constant greater than that of a silicon oxide layer.

The stack structure ST may be sequentially covered with a first interlayer dielectric layer 16 and/or a second interlayer dielectric layer 18. Each of the first and second interlayer dielectric layers 16 and 18 may have a single-layered or multi-layered structure including one or more of a silicon oxide layer, a silicon nitride layer, and a silicon oxynitride layer. The bit-line conductive pads 34 on the cell vertical patterns VS may be connected to the bit lines BL through bit-line contact plugs BPLG that penetrate the first and second interlayer dielectric layers 16 and 18. The bit lines BL may extend in a second direction D2 that intersects the first direction D1 and may be parallel to each other. The bit-line contact plugs BPLG and the bit lines BL may include metal, such as tungsten, aluminum, and copper. On the dummy cell region DCR and the connection region CNR, neither the bit-line contact plug BPLG nor the bit line BL may be disposed on the bit-line conductive pad 34. In some example embodiments, the dummy cell region DCR may include dummy bit-line contact plugs (not shown) and dummy bit lines (not shown) on the bit-line conductive pads 34. In some example embodiments, the dummy bit lines may be electrically floated without voltage supply. Likewise the bit lines BL, the dummy bit lines may also extend in the second direction D2.

The cell array structure CS may include the stack structure ST, the first and second interlayer dielectric layers 16 and 18, and/or the bit lines BL. First source contact plugs CSPLG1 may be disposed between neighboring memory blocks BLK included in the cell array structure CS. In addition, second source contact plugs CSPLG2 may each be disposed on a central portion of one memory block BLK and may each divide the one memory block BLK into two sections in the second direction D2. As shown in the plan view of FIG. 2, the first source contact plug CSPLG1 may have a linear shape that is continuously elongated in the first direction D1. On the other side, the second source contact plug CSPLG2 may have a discontinuous section (or cut area) on the connection region CNR.

As shown in the cross-section of FIG. 3B, the first source contact plug CSPLG1 and the second source contact plug CSPLG2 may be spaced apart from each other and adjacent to the substrate 10, while penetrating the first interlayer dielectric layer 16 and the stack structure ST. Dielectric spacers SP may be interposed between the stack structure ST and the first source contact plugs CSPLG1 and between the stack structure ST and the second source contact plugs CSPLG2. The substrate 10 may have therein common source regions CSR that are correspondingly in contact with the first source contact plugs CSPLG1 and the second source contact plugs CSPLG2. The common source region CSR may be doped with impurities having a second conductivity type opposite to that of impurities doped in the substrate 10. The first and second source contact plugs CSPLG1 and CSPLG2 may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum).

Referring to FIGS. 3A and 4B, abnormal dummy vertical patterns DVS2_1 to DVS2_4 may be disposed on the connection region CNR. The abnormal dummy vertical patterns DVS2_1 to DVS2_4 may correspond to portions of the second dummy vertical patterns DVS2. The abnormal dummy vertical patterns DVS2_1 to DVS2_4 may include first to fourth abnormal dummy vertical patterns DVS2_1 to DVS2_4. The first to fourth abnormal dummy vertical patterns DVS2_1 to DVS2_4 may be disposed in first to fourth abnormal vertical holes FCH1 to FCH4, respectively. The abnormal dummy vertical patterns DVS2_1 to DVS2_4 may not be connected to the bit lines BL. No voltage may be applied to the abnormal dummy vertical patterns DVS2_1 to DVS2_4. The abnormal dummy vertical patterns DVS2_1 to DVS2_4 may each have a hollow cup shape.

The abnormal dummy vertical patterns DVS2_1 to DVS2_4 may each include a channel spacer layer 25 and/or a channel connection layer 27, as shown in FIG. 4B. The channel spacer layer 25 and/or the channel connection layer 27 may be formed of a polysilicon layer or a single-crystalline silicon layer doped with impurities. Second gate dielectric layers GIF may be interposed between the abnormal dummy vertical patterns DVS2_1 to DVS2_4 and inner walls of the abnormal vertical holes FCH1 to FCH4. The second gate dielectric layers GIF may each include a tunnel dielectric layer TL, a charge storage layer SN, and/or a blocking dielectric layer BCL, as shown in FIG. 4B. The second gate dielectric layers GIF may cover corresponding bottom surfaces of the abnormal vertical holes FCH1 to FCH4. The abnormal dummy vertical patterns DVS2_1 to DVS2_4 may not penetrate the second gate dielectric layers GIF and may be spaced apart from the bottom surfaces of the abnormal vertical holes FCH1 to FCH4. One or more of the electrode layers EL1, EL, ELm, and ELn may be interposed between the substrate 10 and the abnormal dummy vertical patterns DVS2_1 to DVS2_4. The second gate dielectric layers GIF may insulate the abnormal dummy vertical patterns DVS2_1 to DVS2_4 from the electrode layers EL1, EL, ELm, and ELn.

For example, the first abnormal dummy vertical pattern DVS2_1 may be disposed in the first abnormal vertical hole FCH1. The first abnormal vertical hole FCH1 may have a sharp lower portion. A lowermost end of the first abnormal vertical hole FCH1 may be adjacent to a half height of the stack structure ST. As shown in FIG. 3A, approximately seven electrode layers EL1 and EL may be interposed between the substrate 10 and the lowermost end of the first abnormal vertical hole FCH1. The first abnormal dummy vertical pattern DVS2_1 may vertically overlap the approximately seven electrode layers EL1 and EL. The second gate dielectric layer GIF and/or the first abnormal dummy vertical pattern DVS2_1 that are disposed in the first abnormal vertical hole FCH1 may have sharp lower portions. For example, the first abnormal dummy vertical pattern DVS2_1 may have an upper width and a lower width parallel to the first direction D1, and the lower width may be preferably about 85% or less, more preferably about 35% to about 85%, of the upper width.

The first abnormal dummy vertical pattern DVS2_1 may penetrate the planarized dielectric layer 20, one or more of the inter-electrode dielectric layers 12, and one or more of the middle electrode layers EL.

The second abnormal dummy vertical pattern DVS2_2 may be disposed in the second abnormal vertical hole FCH2. The second abnormal vertical hole FCH2 may have a flat bottom surface. A lowermost end of the second abnormal vertical hole FCH2 may be closer than the first abnormal vertical hole FCH1 to the substrate 10. As shown in FIG. 3A, two electrode layers EL1 and EL may be interposed between the substrate 10 and the lowermost end of the second abnormal vertical hole FCH2 (or between the substrate 10 and the second abnormal dummy vertical pattern DVS2_2). The second abnormal dummy vertical pattern DVS2_2 may vertically overlap the two electrode layers EL1 and EL. The second gate dielectric layer GIF and the second abnormal dummy vertical pattern DVS2_2 that are disposed in the second abnormal vertical hole FCH2 may also have flat bottom surfaces. The second abnormal dummy vertical pattern DVS2_2 may penetrate the planarized dielectric layer 20, one or more of the inter-electrode dielectric layers 12, and/or one or more of the middle electrode layers EL.

The third abnormal dummy vertical pattern DVS2_3 may be disposed in the third abnormal vertical hole FCH3. The third abnormal vertical hole FCH3 may have a flat bottom surface and/or an inclined sidewall. A lowermost end of the third abnormal vertical hole FCH3 may be closer than the first abnormal vertical hole FCH1 to the substrate 10, but farther away than the second abnormal vertical hole FCH2 from the substrate 10. The third abnormal vertical hole FCH3 may have a bottom surface on one of the middle electrode layers EL. As shown in FIG. 3A, approximately four electrode layers EL1 and EL may be interposed between the substrate 10 and the lowermost end of the third abnormal vertical hole FCH3 (or between the substrate 10 and the third abnormal dummy vertical pattern DVS2_3). The third abnormal dummy vertical pattern DVS2_3 may vertically overlap the approximately four electrode layers EL1 and EL. The second gate dielectric layer GIF and/or the third abnormal dummy vertical pattern DVS2_3 that are disposed in the third abnormal vertical hole FCH3 may have sharp lower portions. The third abnormal dummy vertical pattern DVS2_3 may penetrate the planarized dielectric layer 20, one or more of the inter-electrode dielectric layers 12, and/or one or more of the middle electrode layers EL.

The fourth abnormal dummy vertical pattern DVS2_4 may be disposed in the fourth abnormal vertical hole FCH4. The fourth abnormal vertical hole FCH4 may have a flat bottom surface and/or an inclined sidewall. A lowermost end of the fourth abnormal vertical hole FCH4 may be closer than the first abnormal vertical hole FCH1 to the substrate 10, but farther away than the third abnormal vertical hole FCH3 from the substrate 10. The fourth abnormal vertical hole FCH4 may be formed in the planarized dielectric layer 20 and/or may be spaced apart from the inter-electrode dielectric layers 12 and the electrode layers EL1, EL, ELm, and ELn. As shown in FIG. 3A, three electrode layers EL1 and EL may be interposed between the substrate 10 and the lowermost end of the fourth abnormal vertical hole FCH4 (or between the substrate 10 and the fourth abnormal dummy vertical pattern DVS2_4). The fourth abnormal dummy vertical pattern DVS2_4 may vertically overlap the three electrode layers EL1 and EL. The second gate dielectric layer GIF and/or the fourth abnormal dummy vertical pattern DVS2_4 that are disposed in the fourth abnormal vertical hole FCH4 may have flat bottom surfaces. The fourth abnormal dummy vertical pattern DVS2_4 may penetrate a portion of the planarized dielectric layer 20.

The first to fourth abnormal dummy vertical patterns DVS2_1 to DVS2_4 may have lateral and bottom surfaces that are surrounded by the second gate dielectric layers GIF and are electrically insulated from the electrode layers EL1, EL, ELm, and ELn. Accordingly, programming failure and/or current leakage may be reduced or prevented in the three-dimensional semiconductor memory device, and thus may increase reliability. FIG. 3A shows four abnormal vertical holes and four abnormal dummy vertical patterns, but no limitation is imposed on both the number of the abnormal vertical holes and the number of the abnormal dummy vertical patterns. For example, the number of the abnormal vertical holes or the abnormal dummy vertical patterns may be less or greater than four.

FIGS. 5A to 9A illustrate cross-sectional views showing a method of fabricating a three-dimensional semiconductor memory device having the cross-section of FIG. 3A according to some example embodiments of the present inventive concepts. FIGS. 5B to 9B illustrate cross-sectional views showing a method of fabricating a three-dimensional semiconductor memory device having the cross-section of FIG. 3B according to some example embodiments of the present inventive concepts.

Figure 5A:
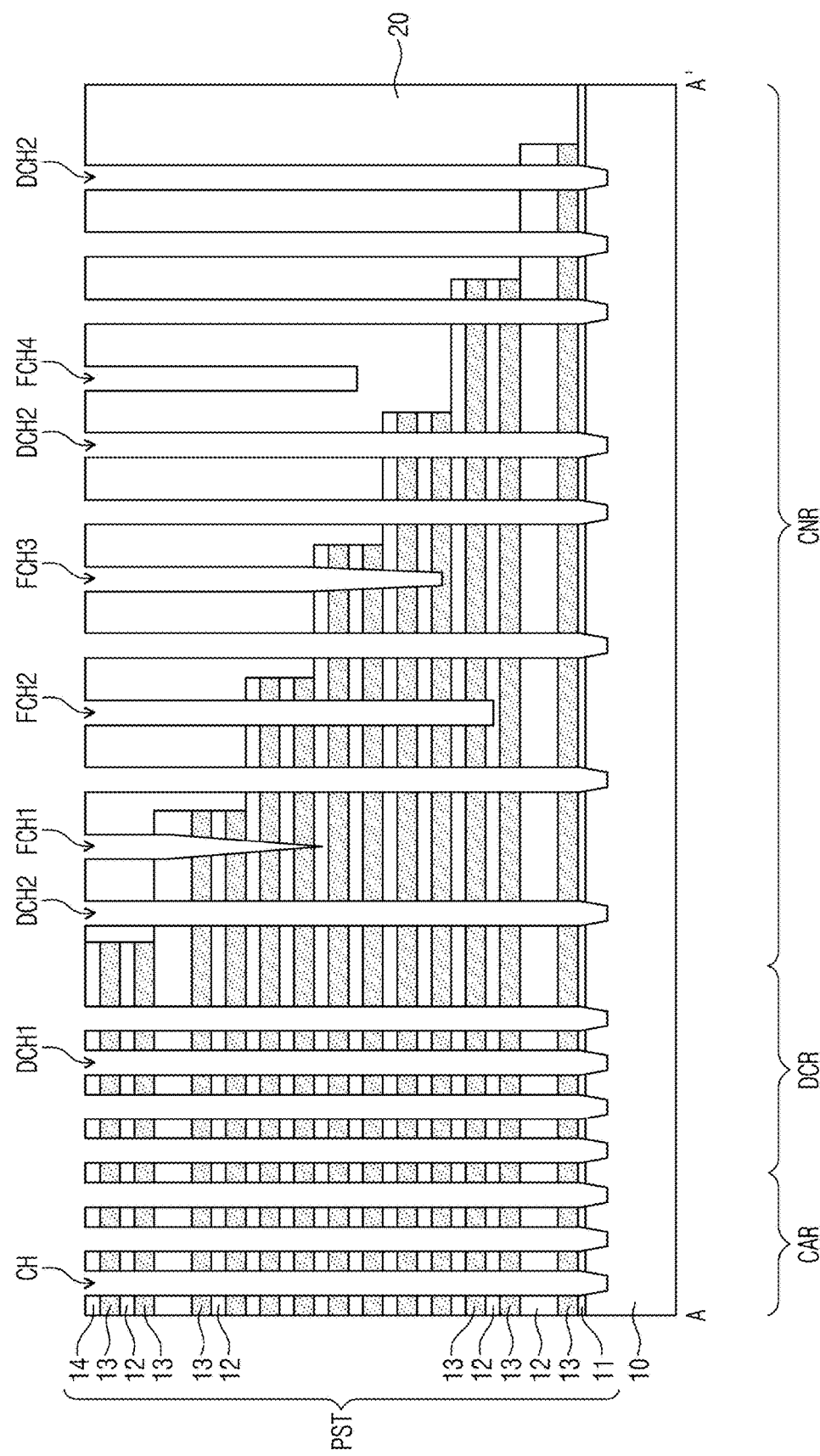
Figure 5B:
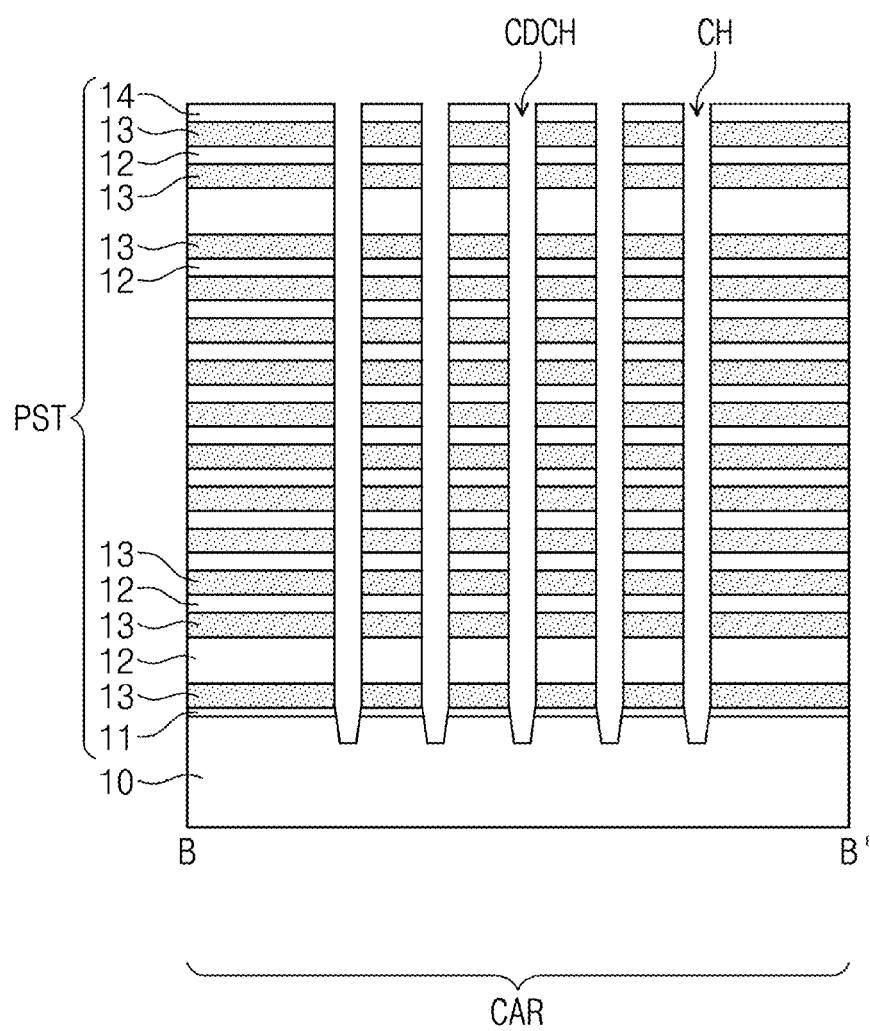

Referring to FIGS. 5A and 5B, a substrate 10 may be prepared which includes a cell region CAR, a dummy cell region DCR, and/or a connection region CNR. A buffer dielectric layer 11 may be formed on the substrate 10. The buffer dielectric layer 11 may include, for example, a silicon oxide layer. Inter-electrode dielectric layers 12 and/or sacrificial layers 13 may be alternately formed on the buffer dielectric layer 11. A capping dielectric layer 14 may be formed on an uppermost one of the sacrificial layers 13. As such, a preliminary stack structure PST may be formed. The sacrificial layers 13 may be formed of a material having an etch selectivity with respect to the buffer dielectric layer 11, the inter-electrode dielectric layers 12, and/or the capping dielectric layer 14. For example, the sacrificial layers 13 may be formed of a silicon nitride layer. The buffer dielectric layer 11, the inter-electrode dielectric layers 12, and/or the capping dielectric layer 14 may be formed of, for example, a silicon oxide layer. A trimming process and an etching process may be alternately and repeatedly performed to cause the preliminary stack structure PST to have a stepwise end on the connection region CNR. A planarized dielectric layer 20 may be formed on an entire surface of the substrate 10, and then a chemical mechanical polishing (CMP) process may be performed to remove the planarized dielectric layer 20 that covers the end of the preliminary stack structure PST.

An etching process may be performed such that the preliminary stack structure PST and the planarized dielectric layer 20 are etched to form cell vertical holes CH and a central dummy vertical hole CDCH that are spaced apart from each other on the cell region CAR, and also to form first dummy vertical holes DCH1 and second dummy vertical holes DCH2 respectively on the dummy cell region DCR and the connection region CNR. The substrate 10 may be exposed to the cell vertical holes CH, the central dummy vertical hole CDCH, the first dummy vertical holes DCH1, and the second dummy vertical holes DCH2. The first dummy vertical holes DCH1 may be formed so as to reduce or prevent the cell vertical holes CH from defects caused by a loading effect due to a difference in pattern density.

The cell vertical holes CH, the central dummy vertical hole CDCH, and the first dummy vertical holes DCH1 may have the same size and the same interval therebetween. The second dummy vertical holes DCH2 may have their size and interval greater than those of the cell vertical holes CH. When the etching process is performed, on the cell region CAR and the dummy cell region DCR each of which has a uniform hole density, the cell vertical holes CH, the central dummy vertical hole CDCH, and the first dummy vertical holes DCH1 may be formed to have a uniform width and depth almost without failure so as to expose the substrate 10. In contrast, since the second dummy vertical holes DCH2 have a relatively low density, a clogging-like failure may occur due to a loading effect when the etching process is performed. For example, during the formation of the second dummy vertical holes DCH2, etching-byproducts such as polymers may pile up on the bottom and/or lateral surfaces of one or more of the second dummy vertical holes DCH2, and thus the one or more of the second dummy vertical holes DCH2 may not be further etched, which may result in the generation of not-open defects where the substrate 10 is not exposed. It may be likely that the clogging-like failure occurs due to a step-difference between the connection region CNR and the cell region CAR. Therefore, first to fourth abnormal vertical holes FCH1 to FCH4 may be formed on the connection region CNR during the etching process. The first to fourth abnormal vertical holes FCH1 to FCH4 may be various in depth, position, and shape.

Figure 6A:
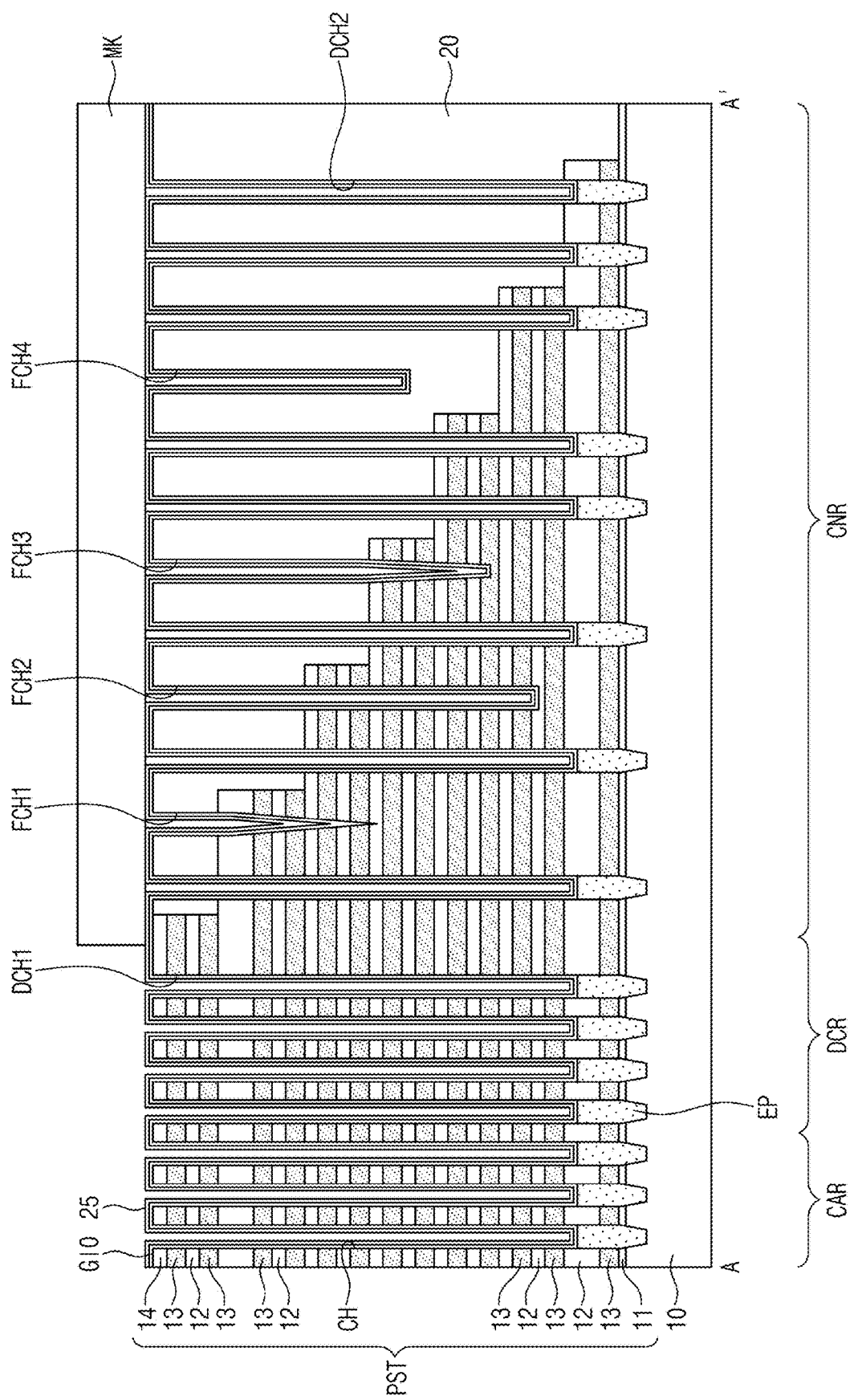
Figure 6B:
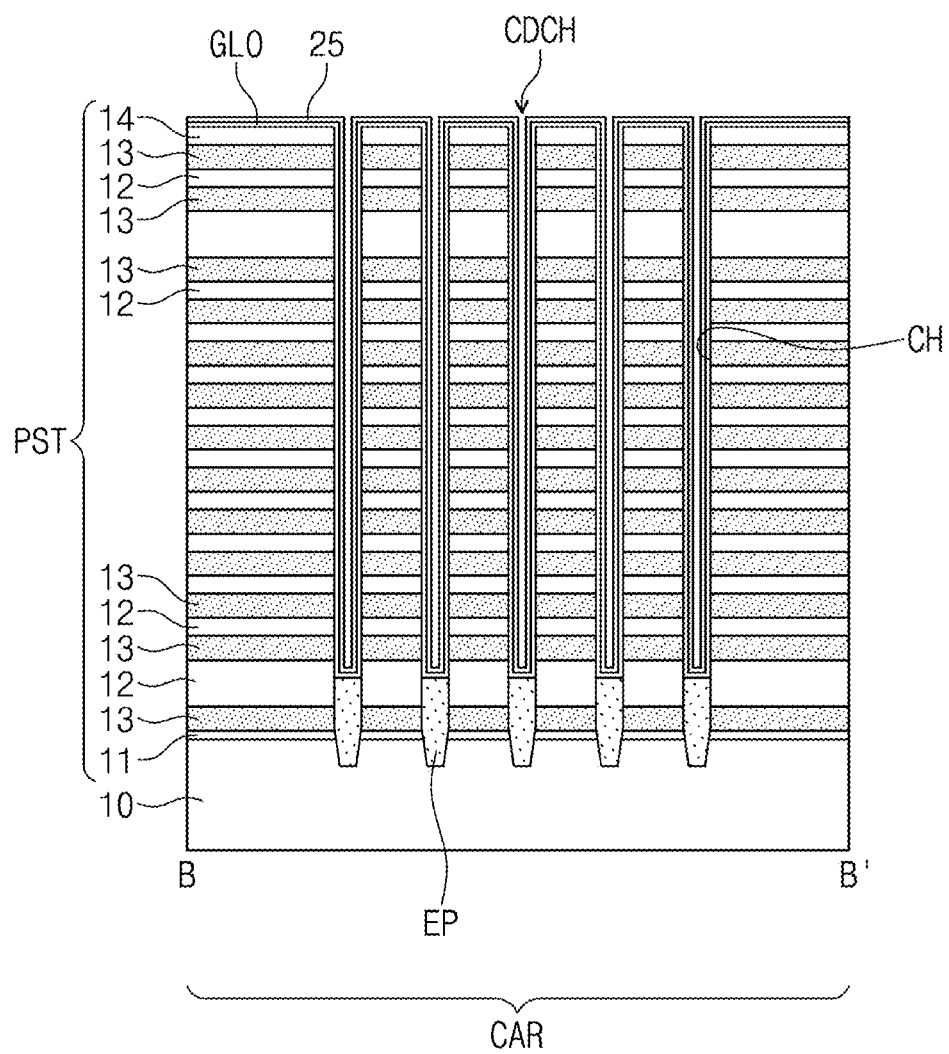

Referring to FIGS. 6A and 6B, a selective epitaxial growth (SEG) process may be performed to form semiconductor patterns EP in the holes CH, CDCH, DCH1, and DCH2. Impurities having a first conductivity type may be in-situ doped when the semiconductor patterns EP are formed. At this stage, since the abnormal vertical holes FCH1 to FCH4 do not expose the substrate 10, the semiconductor patterns EP may not be formed in the abnormal vertical holes FCH1 to FCH4. A gate dielectric layer GIO may be conformally formed on the entire surface of the substrate 10. The gate dielectric layer GIO may be formed by sequentially forming a tunnel dielectric layer TL, a charge storage layer SN, and/or a blocking dielectric layer BCL, as shown in FIG. 4A. A channel spacer layer 25 may be conformally formed on the gate dielectric layer GIO. The channel spacer layer 25 may be formed of a polysilicon layer. The gate dielectric layer GIO and/or the channel spacer layer 25 may also be conformally formed on inner walls and/or bottom surfaces of the holes CH, CDCH, DCH1, DCH2, and FCH1 to FCH4. On the connection region CNR, a mask pattern MK may be formed on the channel spacer layer 25. The mask pattern MK may be formed to expose the cell region CAR and/or the dummy cell region DCR. The mask pattern MK may be formed of, for example, a layer having poor step-coverage properties, and thus may not enter the holes CH, CDCH, DCH1, DCH2, and FCH1 to FCH4. For example, the mask pattern MK may be formed of an amorphous carbon layer (ACL). Therefore, in subsequent processes, it may be possible to reduce or prevent defects caused by the mask pattern MK that remains in the holes CH, CDCH, DCH1, DCH2, and FCH1 to FCH4.

Figure 7A:
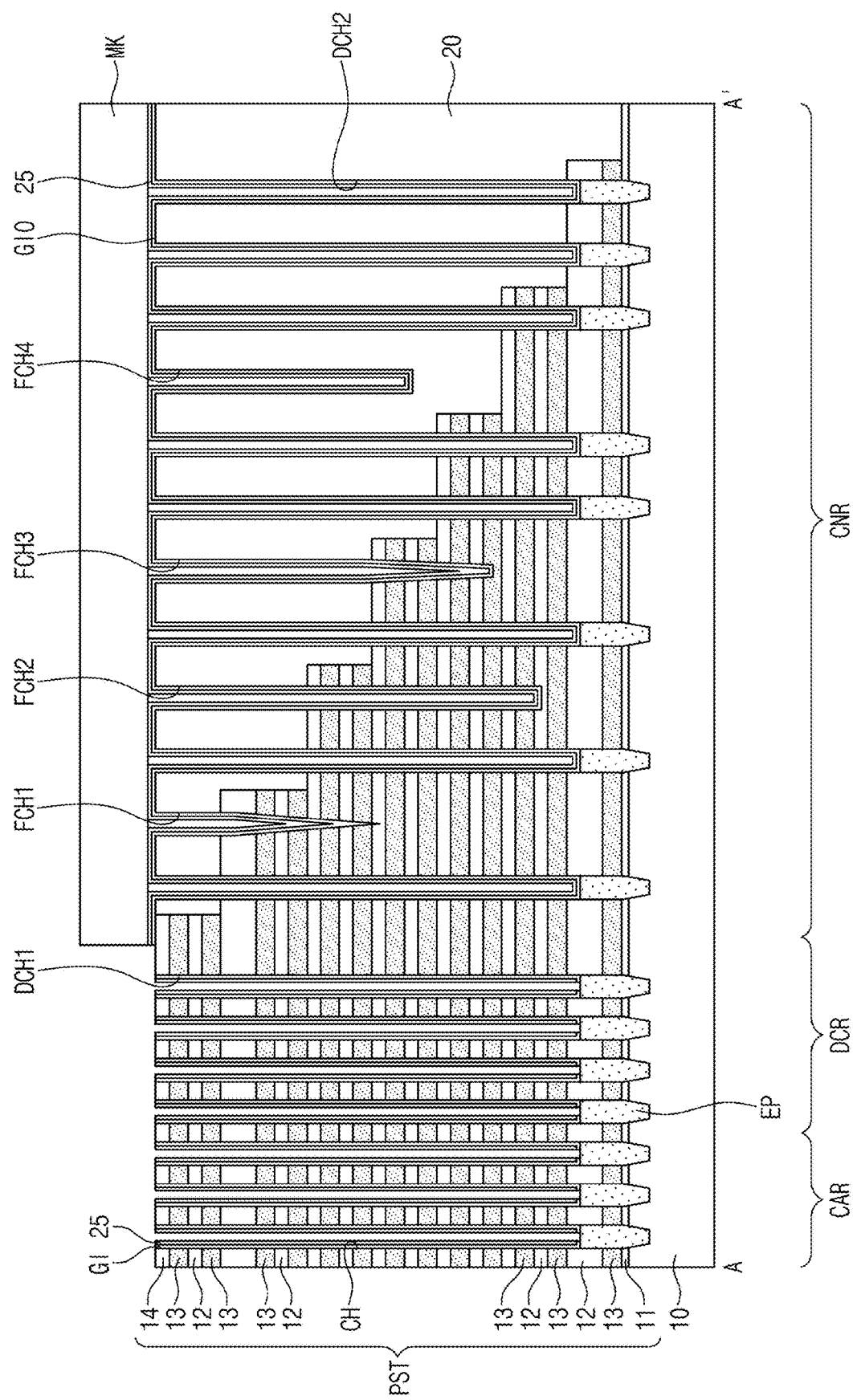
Figure 7B:
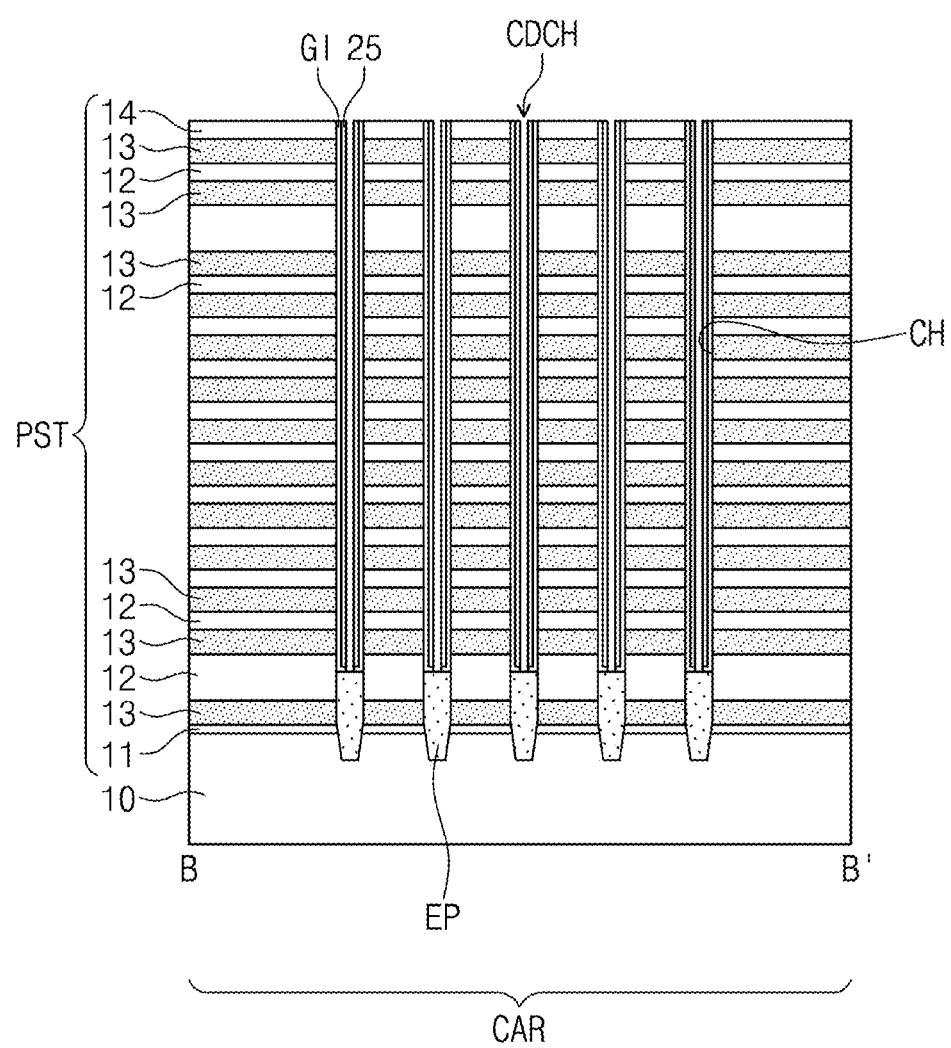
Figure 8A:
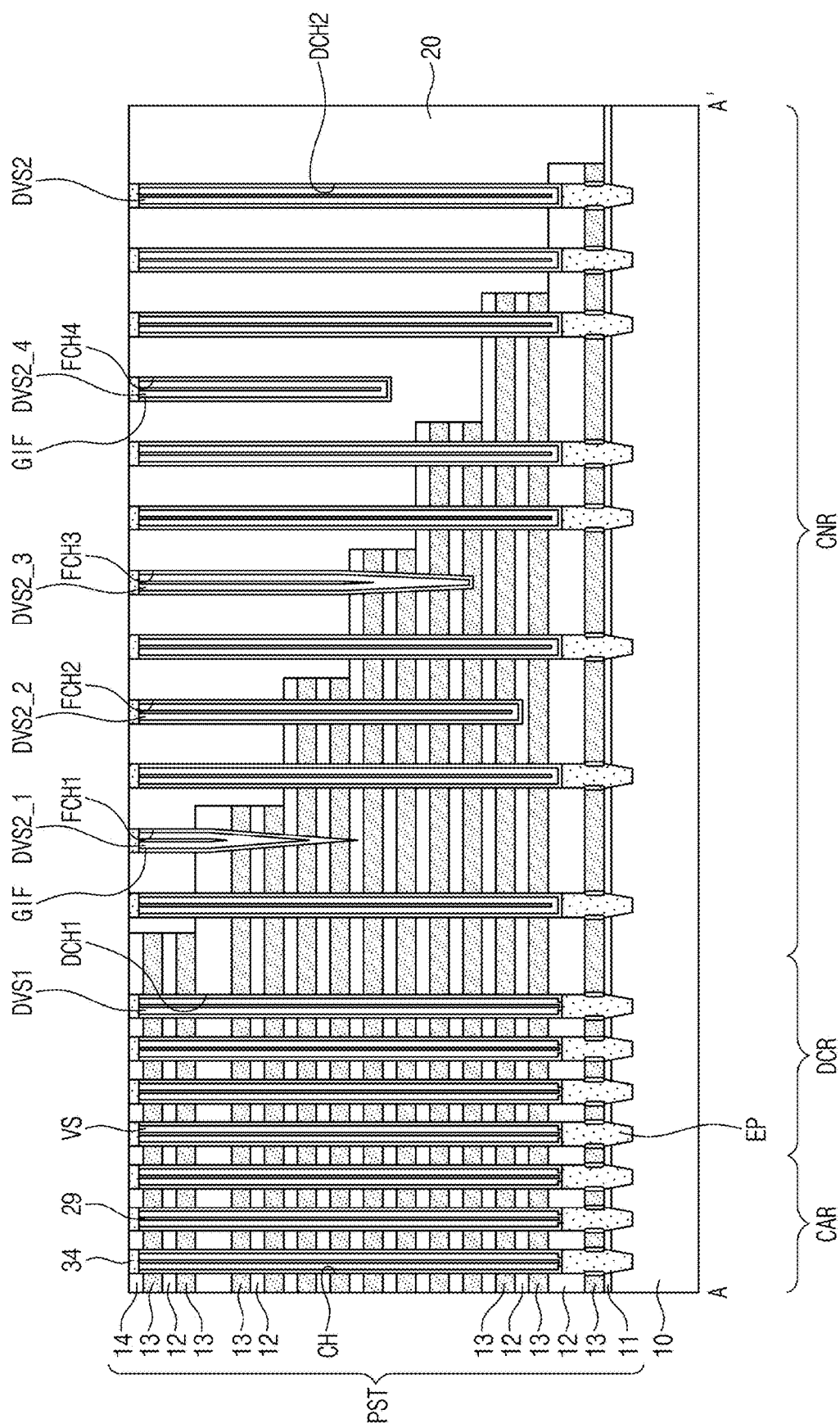
Figure 8B:
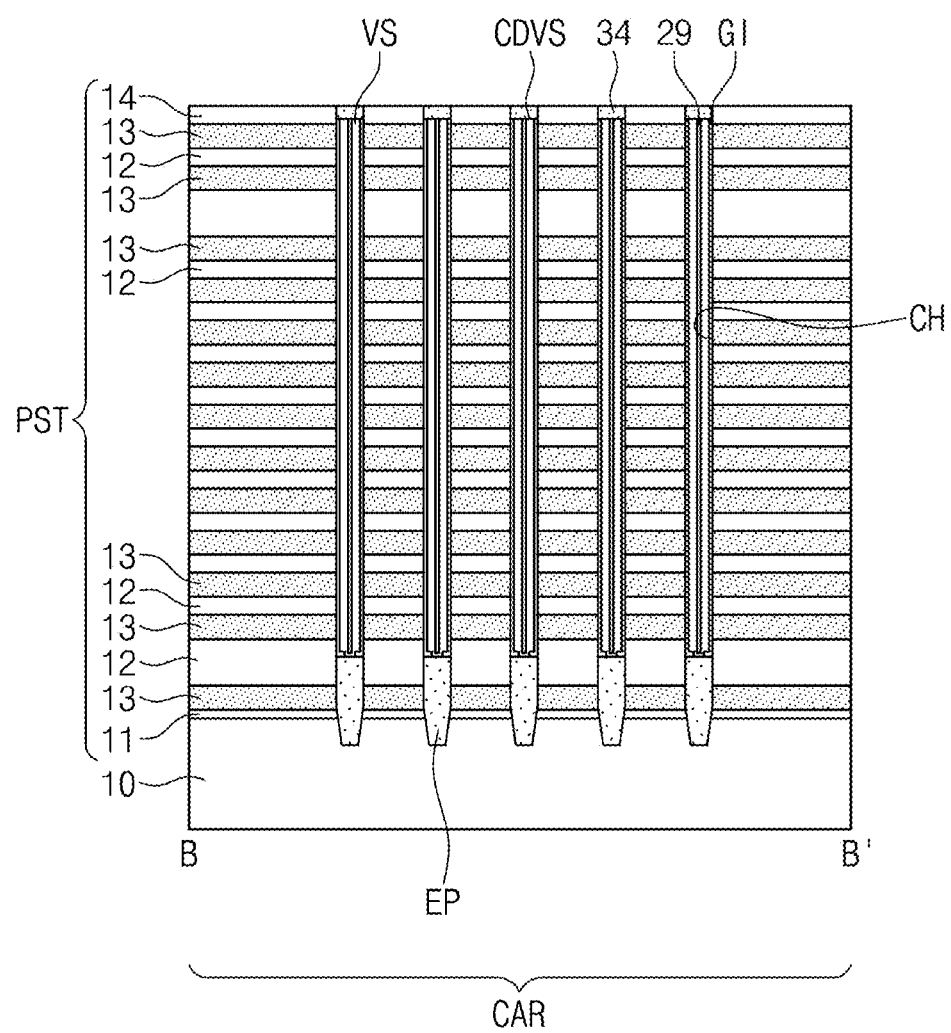

Referring to FIGS. 7A and 7B, the mask pattern MK may be used as an etching mask to etch the channel spacer layer 25 and/or the gate dielectric layer GIO that are exposed on the cell region CAR and/or the dummy cell region DCR, such that a plurality of channel spacer layers 25 and/or a plurality of first gate dielectric layers GI may be formed to expose top surfaces of the semiconductor patterns EP and to cover sidewalls of the vertical holes CH, a sidewall of the central dummy vertical hole CDCH, and sidewalls of the first dummy vertical holes DCH1.

Referring to FIGS. 4A, 4B, 7A, 7B, 8A, and 8B, the mask pattern MK may be removed to expose the connection region CNR. A channel connection layer 27 may be conformally formed on the entire surface of the substrate 10, thereby contacting sidewalls of the channel spacer layers 25 and the top surfaces of the semiconductor patterns EP. A buried dielectric layer may be formed to fill the holes CH, CDCH, DCH1, DCH2, and FCH1 to FCH4. A chemical mechanical polishing (CMP) process may be performed to remove the gate dielectric layer GIO, the channel connection layer 27, and the buried dielectric layer to form vertical patterns VS, CDVS, DVS1, DVS2, and DVS2_1 to DVS2_4, first and second gate dielectric layers GI and GIF, and buried dielectric patterns 29 in the holes CH, CDCH, DCH1, DCH2, and FCH1 to FCH4. The vertical patterns VS, CDVS, DVS1, DVS2, and DVS2_1 to DVS2_4, the first and second gate dielectric layers GI and GIF, and the buried dielectric patterns 29 may be partially removed from upper portions of the holes CH, CDCH, DCH1, DCH2, and FCH1 to FCH4, and then a conductive layer may be formed to form bit-line conductive pads 34 in regions where the aforementioned patterns and layers are partially removed.

Figure 9A:
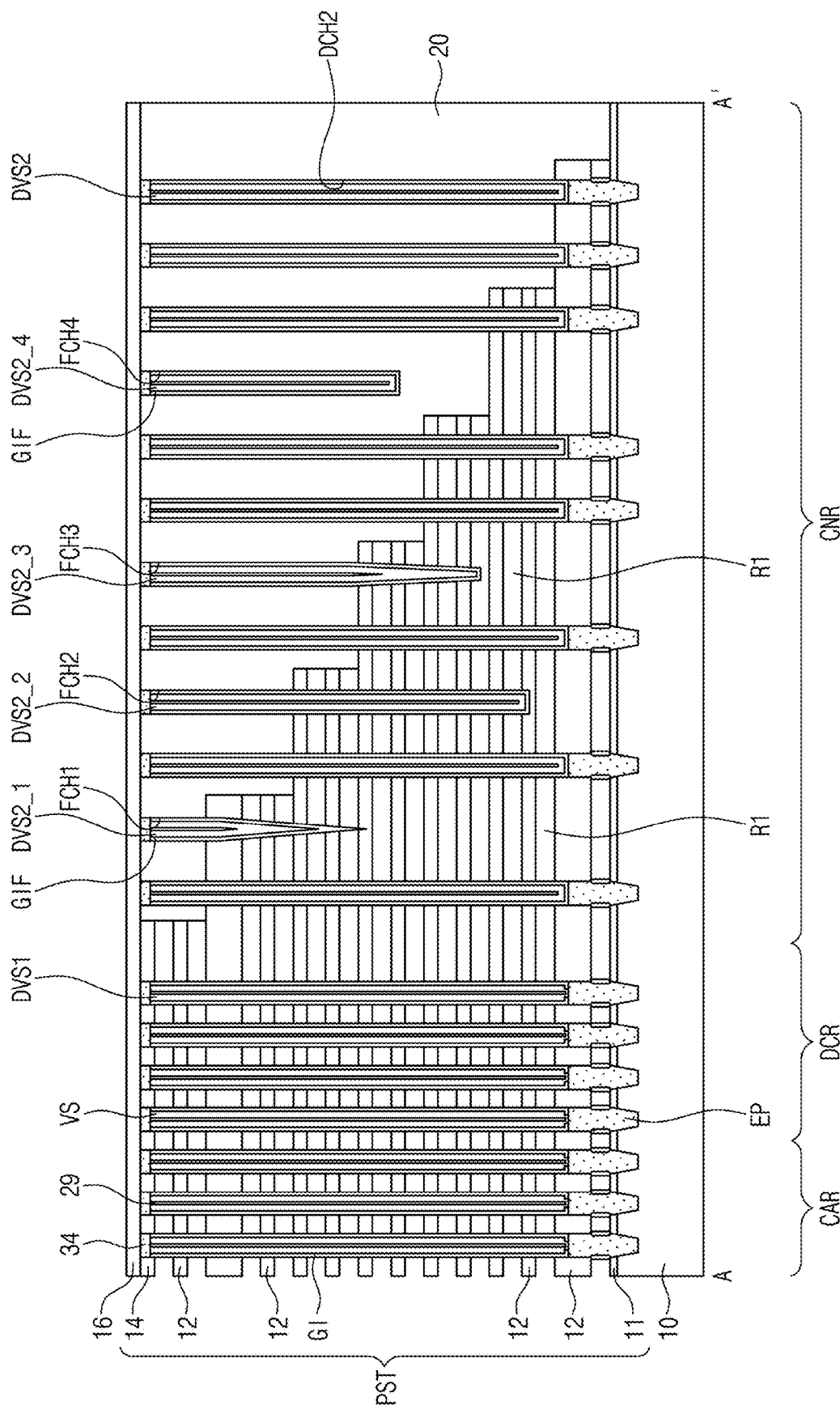
Figure 9B:
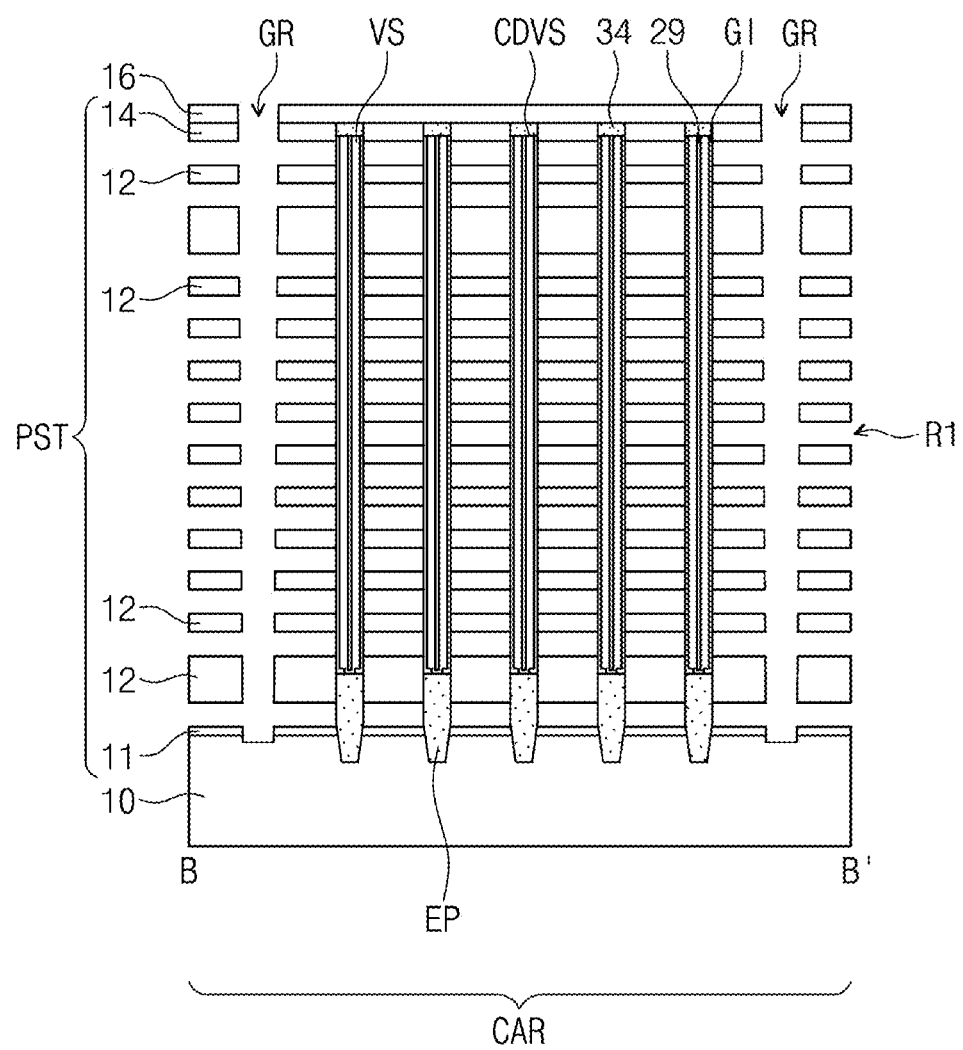

Referring to FIGS. 2, 9A, and 9B, the preliminary stack structure PST may be etched to form grooves GR that extend in a first direction D1 and expose the substrate 10. The sacrificial layers 13 may all be removed through the grooves GR to form empty spaces R1 that expose top and bottom surfaces of the inter-electrode dielectric layers 12, sidewalls of the gate dielectric layers GI and GIF, and sidewalls of the semiconductor patterns EP. At this stage, second dummy vertical patterns DVS2 may reduce or prevent collapse of the preliminary stack structure PST.

Referring to FIGS. 3A, 3B, 4A, 4B, 9A, and 9B, a thermal oxidation process may be performed to form ground gate dielectric layers 22 on the exposed sidewalls of the semiconductor patterns EP. A high-k dielectric layer HL may be conformally formed on the entire surface of the substrate 10, and/or a conductive layer may be formed to fill the empty spaces R1. The conductive layer in the grooves GR may be removed to expose the substrate 10. An ion implantation process may be performed to form common source regions CSR in the substrate 10. A dielectric layer may be conformally formed and then anisotropically etched to form dielectric spacers SP that cover inner walls of the grooves GR. A conductive layer may be formed to fill the grooves GR, and then etched to form first and second source contact plugs CSPLG1 and CSPLG2 in the grooves GR. Subsequently, processes may be performed to form first and second interlayer dielectric layers 16 and 18, bit-line contact plugs BPLG, and bit lines BL.

According to some example embodiments of the present inventive concepts, a method of fabricating a three-dimensional semiconductor memory device may include that the gate dielectric layer GIO is etched to expose the top surfaces of the semiconductor patterns EP under a state where the mask pattern MK covers the connection region CNR having a strong possibility of the occurrence of not-open failure, with the result that the gate dielectric layer GIO may not be etched in the abnormal vertical holes FCH1 to FCH4 on the connection region CNR. The bottom surfaces of the abnormal vertical holes FCH1 to FCH4 may thus be covered with the second gate dielectric layer GIF. Therefore, the channel connection layers 27 of the abnormal dummy vertical patterns DVS2_1 to DVS2_4 may be reduced or prevented from contacting the electrode layers EL and EL1 below the abnormal vertical holes FCH1 to FCH4. As a result, the three-dimensional semiconductor memory device may increase reliability.

Figure 10:
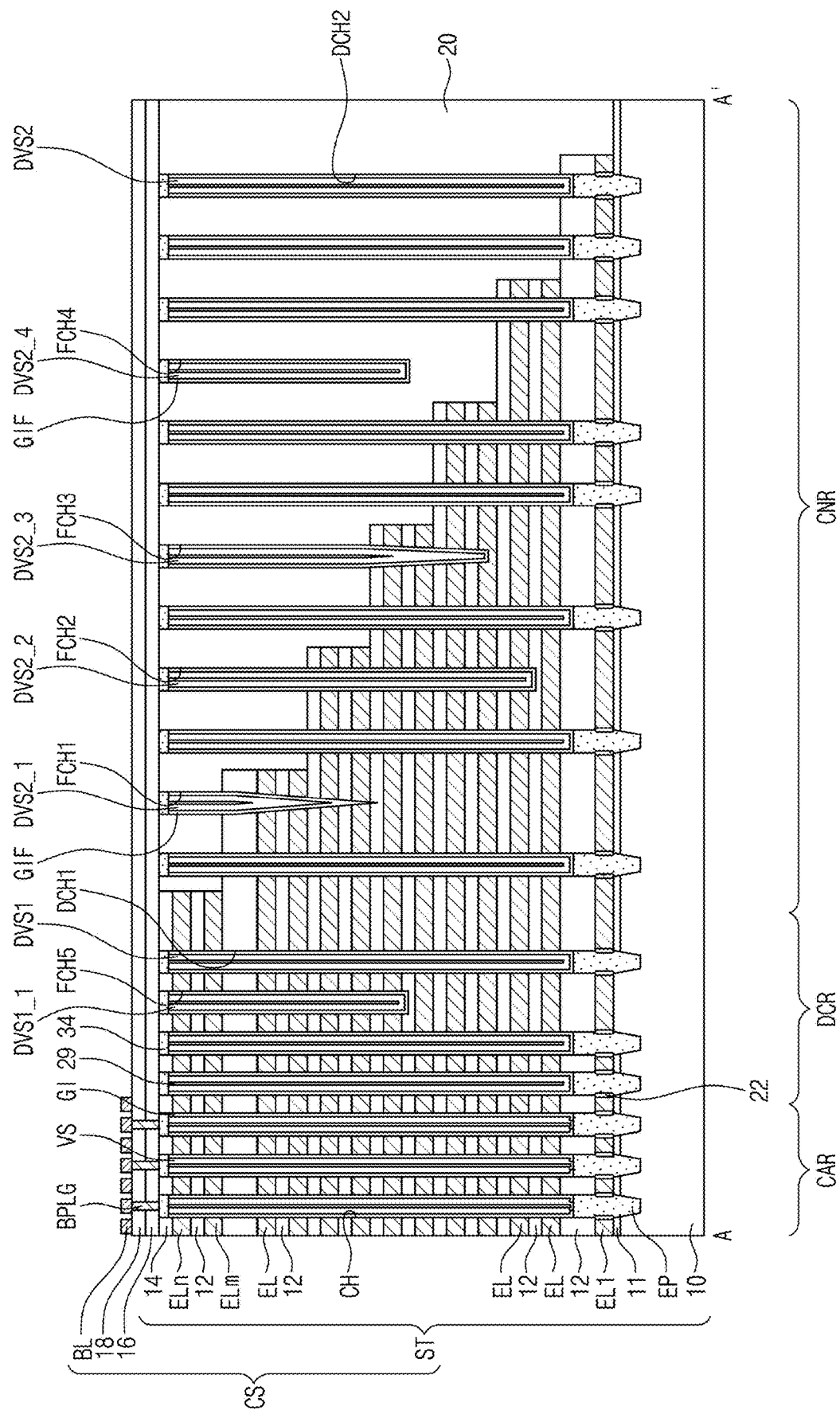
FIG. 10 illustrates a cross-sectional view taken along line A-A' of FIG. 2.

FIG. 10 illustrates a cross-sectional view taken along line A-A' of FIG. 2.

Referring to FIG. 10, a three-dimensional semiconductor memory device according to the present example embodiments may be configured to include a fifth abnormal dummy vertical pattern DVS1_1 on the dummy cell region DCR. The fifth abnormal dummy vertical pattern DVS1_1 may be disposed in a fifth abnormal vertical hole FCH5. The fifth abnormal vertical hole FCH5 may be formed in a portion of the stack structure ST. The fifth abnormal dummy vertical pattern DVS1_1 may correspond to one of the first dummy vertical patterns DVS1. The fifth abnormal vertical hole FCH5 may have a flat bottom surface. The fifth abnormal dummy vertical pattern DVS1_1 may also have a flat bottom surface. The second gate dielectric layer GIF may be interposed between the fifth abnormal dummy vertical pattern DVS1_1 and an inner lateral surface of the fifth abnormal vertical hole FCH5. The fifth abnormal dummy vertical pattern DVS1_1 may not penetrate the second gate dielectric layer GIF and may be spaced apart from the bottom surface of the fifth abnormal vertical hole FCH5. Other configurations may be identical or similar to those discussed with reference to FIGS. 2 to 4B. The three-dimensional semiconductor memory device of FIG. 10 may be fabricated by forming the mask pattern MK to cover up to the dummy cell region DCR (instead of, or in addition to, the CNR region) and then performing subsequent processes.

Figure 11:
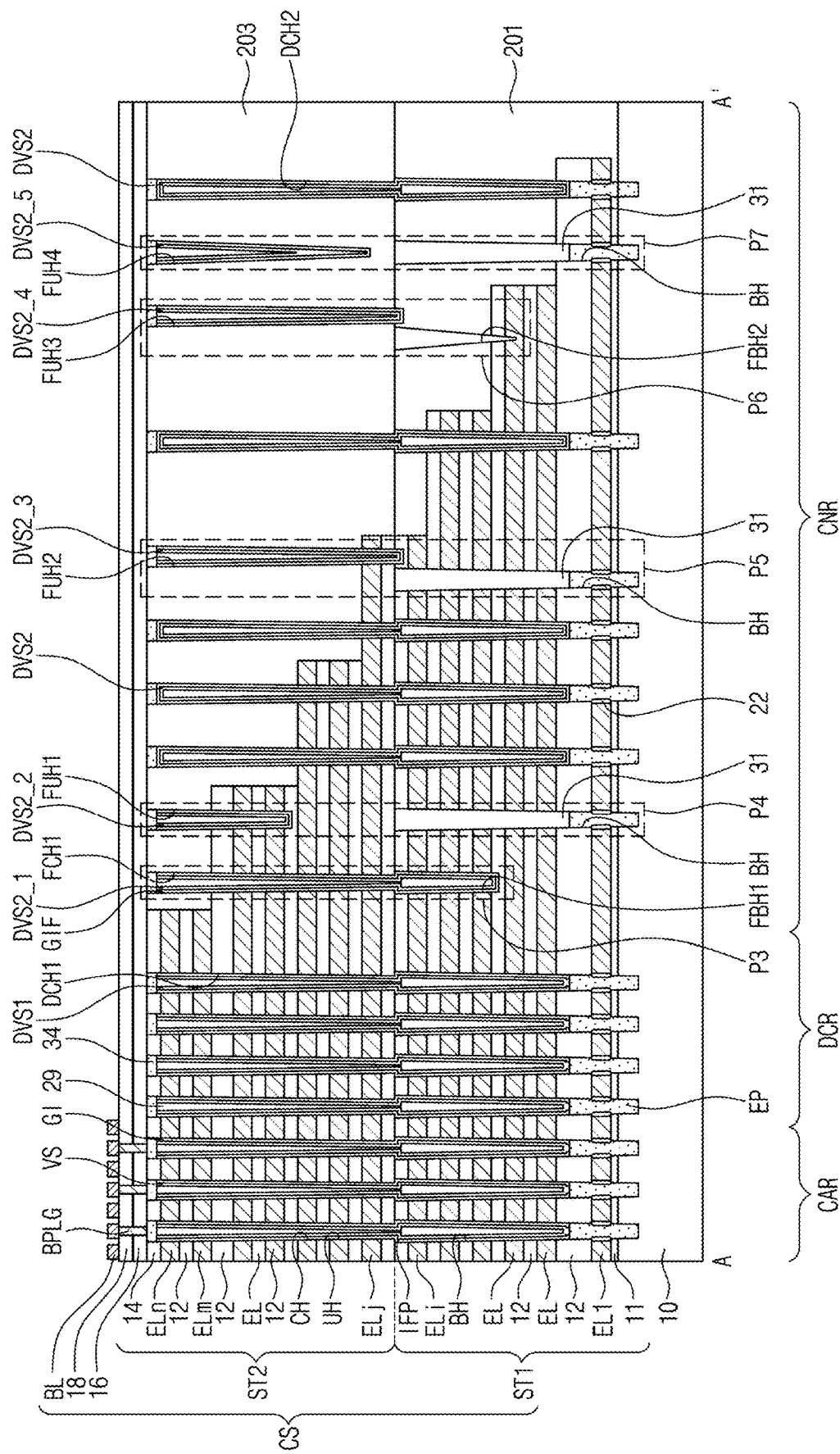
FIG. 11 illustrates a cross-sectional view taken along line A-A' of FIG. 2.

FIG. 11 illustrates a cross-sectional view taken along line A-A' of FIG. 2.

Referring to FIG. 11, the cell array structure CS may include a first sub-stack structure ST1 and/or a second sub-stack structure ST2. The first sub-stack structure ST1 may include a buffer dielectric layer 11 on the substrate 10, and also include inter-electrode dielectric layers 12 and first to $i^{th}$ electrode layers EL1, EL, and ELi that are alternately stacked on the buffer dielectric layer 11. The second sub-stack structure ST2 may include inter-electrode dielectric layers 12 and $j^{th}$ to $n^{th}$ electrode layers ELj, EL, ELm, and ELn that are alternately stacked. Here, i, j, m, and n are integers each greater than 2, wherein i<j<m<n. The vertical hole CH, the central dummy vertical hole CDCH, the first dummy vertical hole DCH1, and the second dummy vertical hole DCH2 may each include a lower hole BH and an upper hole UH that vertically overlap each other and are spatially connected to each other. The vertical hole CH, the central dummy vertical hole CDCH, the first dummy vertical hole DCH1, and/or the second dummy vertical hole DCH2 may have their inner walls each of which has an inflection point between the first sub-stack structure ST1 and the second sub-stack structure ST2. The vertical patterns VS, CDVS, DVS1, and DVS2 may have sidewalls each of which has an inflection point adjacent to a location between the first sub-stack structure ST1 and the second sub-stack structure ST2 (or between the $i^{th}$ electrode layer ELi and the $j^{th}$ electrode layer ELj). The first sub-stack structure ST1 may have an end covered with a lower planarized dielectric layer 201. The lower planarized dielectric layer 201 may have a top surface coplanar with that of the first sub-stack structure ST1. The lower planarized dielectric layer 201 and an end of the second sub-stack structure ST2 may be covered with an upper planarized dielectric layer 203. The upper planarized dielectric layer 203 may have a top surface coplanar with that of the second sub-stack structure ST2.

The first abnormal vertical hole FCH1 may be disposed at a third part P3 of the connection region CNR. The first abnormal vertical hole FCH1 may include an upper hole UH and a first abnormal lower hole FBH1 spatially connected to the upper hole UH. The first abnormal lower hole FBH1 may not expose the substrate 10. The first abnormal vertical hole FCH1 may be formed in the upper planarized dielectric layer 203 and the first and second sub-stack structures ST1 and ST2, and three electrode layers EL1 and EL may be disposed below a bottom surface of the first abnormal lower hole FBH1. A first abnormal dummy vertical pattern DVS2_1 may be disposed in the first abnormal vertical hole FCH1. A sidewall of the first abnormal dummy vertical pattern DVS2_1 may have an inflection point IFP adjacent to a location between the first sub-stack structure ST1 and the second sub-stack structure ST2.

A first abnormal upper hole FUH1 may be disposed at a fourth part P4 of the connection region CNR. The first abnormal upper hole FUH1 may not expose the first sub-stack structure ST1. The first abnormal upper hole FUH1 may be formed in the second sub-stack structure ST2, and three electrode layers ELj and EL of the second sub-stack structure ST2 may be disposed below a bottom surface of the first abnormal upper hole FUH1. The first abnormal upper hole FUH1 may vertically overlap and may be spaced apart from a lower hole BH formed in the first sub-stack structure ST1. The lower hole BH may partially extend into the substrate 10. A semiconductor pattern EP and/or a sacrificial buried pattern 31 may be disposed in the lower hole BH. The sacrificial buried pattern 31 may be in contact with a top surface of the semiconductor pattern EP. The sacrificial buried pattern 31 may have a single-layered or multi-layered structure including one or more of a polysilicon layer, an amorphous carbon layer (ACL), a spin-on-hardmask (SOH) layer, a spin-on-carbon (SOC) layer, a silicon oxide layer, a silicon nitride layer, and a silicon oxynitride layer. A second abnormal dummy vertical pattern DVS2_2 may be disposed in the first abnormal upper hole FUH1.

A second abnormal upper hole FUH2 may be disposed at a fifth part P5 of the connection region CNR. The second abnormal upper hole FUH2 may expose the first sub-stack structure ST1. The second abnormal upper hole FUH2 may not vertically overlap and may be misaligned with a lower hole BH adjacent thereto. The electrode layers ELL EL, and ELi of the first sub-stack structure ST1 may be disposed below the second abnormal upper hole FUH2. A third abnormal dummy vertical pattern DVS2_3 may be disposed in the second abnormal upper hole FUH3. A sacrificial buried pattern 31 may be disposed in the lower hole BH.

A third abnormal upper hole FUH3 may be disposed at a sixth part P6 of the connection region CNR. The third abnormal upper hole FUH3 may expose the first sub-stack structure ST1. The third abnormal upper hole FUH3 may not vertically overlap and may be misaligned with a second abnormal lower hole FBH2 adjacent thereto. The second abnormal lower hole FBH2 may have a sharp lower portion. The electrode layers EL1 and EL of the first sub-stack structure ST1 may be disposed below the third abnormal upper hole FUH3. A fourth abnormal dummy vertical pattern DVS2_4 may be disposed in the third abnormal upper hole FUH3. A sacrificial buried pattern 31 may be disposed in the second abnormal lower hole FBH2.

A fourth abnormal upper hole FUH4 may be disposed at a seventh part P7 of the connection region CNR. The fourth abnormal upper hole FUH4 may not expose the first sub-stack structure ST1. The fourth abnormal upper hole FUH4 may have a sharp lower portion. The fourth abnormal upper hole FUH4 may be spaced apart from a lower hole BH therebelow. A sacrificial buried pattern 31 may be disposed in the lower hole BH. A fifth abnormal dummy vertical pattern DVS2_5 may be disposed in the fourth abnormal upper hole FUH4. Other configurations may be identical or similar to those discussed with reference to FIGS. 2 to 4B.

The following will describe a method of fabricating the three-dimensional semiconductor memory device of FIG. 11.

Figure 12:
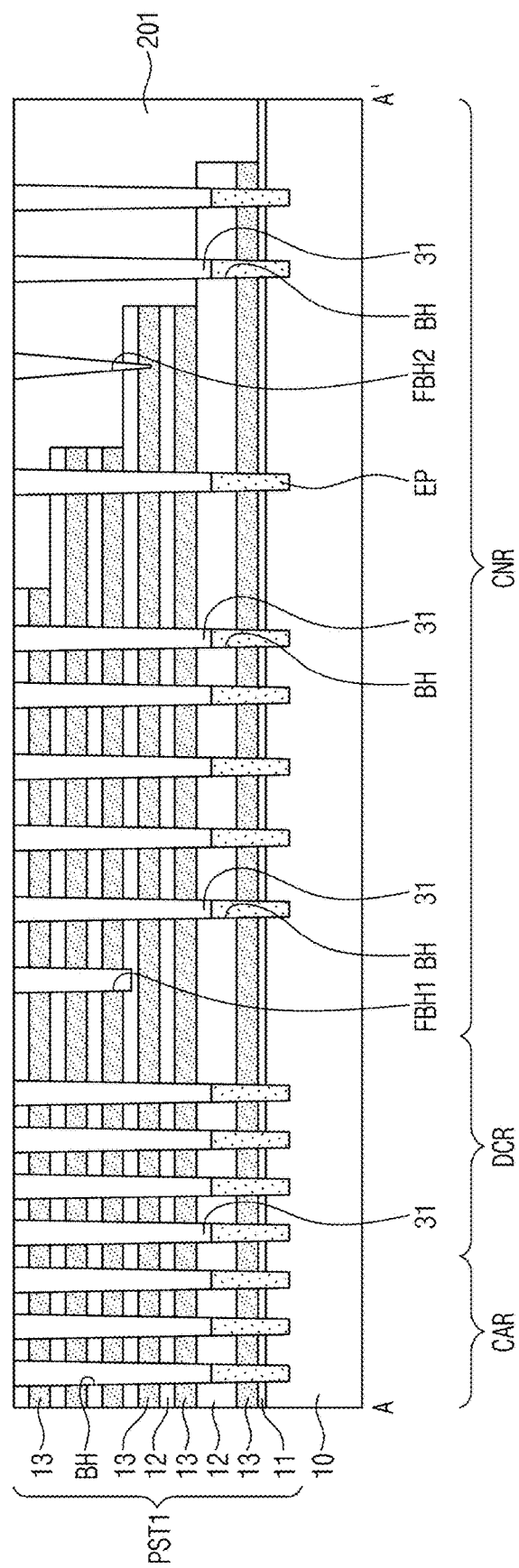
FIGS. 12 to 14 illustrate cross-sectional views showing a method of fabricating the three-dimensional semiconductor memory device of FIG. 11.
Figure 13:
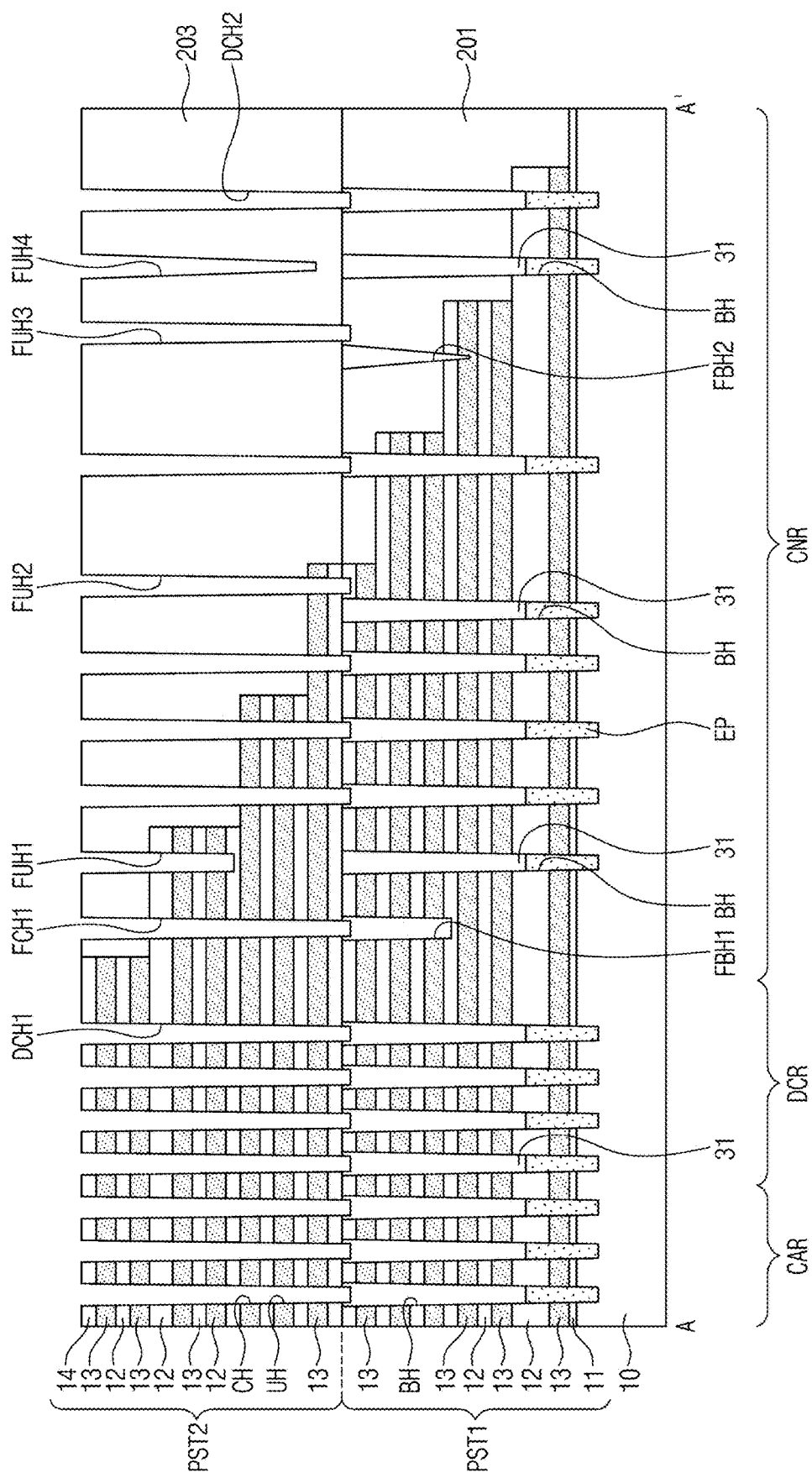
Figure 14:
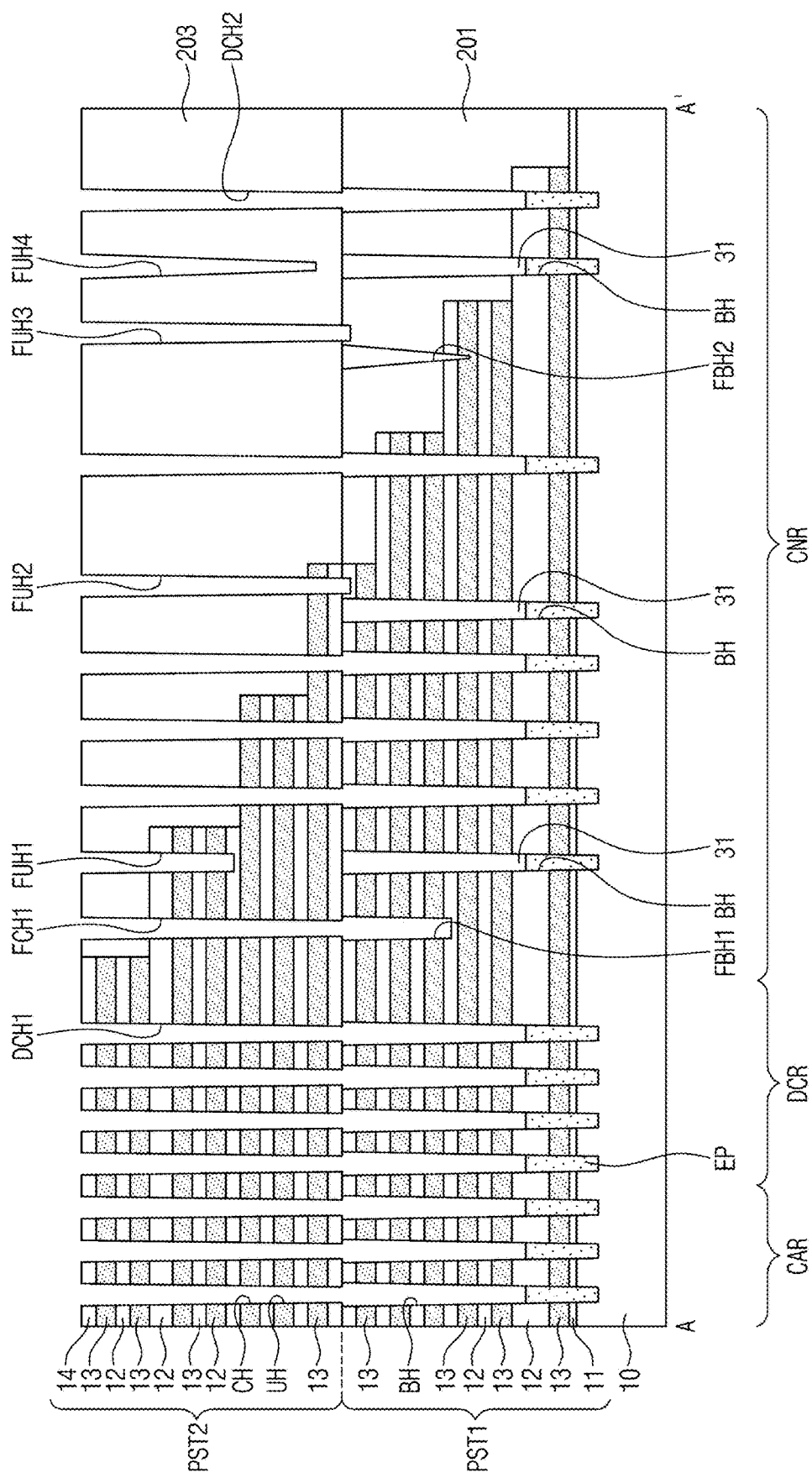

FIGS. 12 to 14 illustrate cross-sectional views showing a method of fabricating the three-dimensional semiconductor memory device of FIG. 11.

Referring to FIG. 12, a buffer dielectric layer 11 may be formed on a substrate 10 that includes a cell region CAR, a dummy cell region DCR, and/or a connection region CNR. Sacrificial layers 13 and inter-electrode dielectric layers 12 may be alternately formed on the buffer dielectric layer 11, thereby forming a first preliminary sub-stack structure PST1. A trimming process and an etching process may be repeatedly performed to cause the first preliminary sub-stack structure PST1 to have a stepwise end. A lower planarized dielectric layer 201 may be formed, and then a chemical mechanical polishing (CMP) process may be performed to allow the lower planarized dielectric layer 201 to cover the end of the first preliminary sub-stack structure PST1. The first preliminary sub-stack structure PST1 may be etched to form lower holes BH that expose the substrate 10. At this stage, on the connection region CNR, a clogging-like failure may occur to form abnormal lower holes FBH1 and FBH2. A selective epitaxial growth (SEG) process may be performed to form semiconductor patterns EP in the lower holes BH. A sacrificial buried layer may be formed to fill the lower holes BH and the abnormal lower holes FBH1 and FBH2, and then a blanket etch-back process may be performed to form lower sacrificial buried patterns 31.

Referring to FIG. 13, inter-electrode dielectric layers 12 and sacrificial layers 13 may be alternately formed on the first preliminary sub-stack structure PST1, and then a capping dielectric layer 14 may be formed on an uppermost one of the sacrificial layers 13, with the result that a second preliminary sub-stack structure PST2 may be formed. A trimming process and an etching process may be repeatedly performed to cause the second preliminary sub-stack structure PST2 to have a stepwise end. An upper planarized dielectric layer 203 may be formed, and then a chemical mechanical polishing (CMP) process may be performed to allow the upper planarized dielectric layer 203 to cover the end of the second preliminary sub-stack structure PST2. The second preliminary sub-stack structure PST2 may be etched to form upper holes UH that expose the lower sacrificial buried patterns 31. At this stage, on the connection region CNR, a clogging-like failure may occur to form abnormal upper holes FUH1 to FUH4.

Referring to FIG. 14, the substrate 10 may be exposed by removing the lower sacrificial buried patterns 31 exposed to the upper holes UH. The lower sacrificial buried patterns 31 below or adjacent to the abnormal upper holes FUH1 to FUH4 may not be removed but may remain. A selective epitaxial growth (SEG) process may be performed to form semiconductor patterns EP. The semiconductor patterns EP may not be formed in the abnormal lower holes FBH1 and FBH2 or in the lower holes BH below or adjacent to the abnormal upper holes FUH1 and FUH2. Processes discussed with reference to FIGS. 6A to 9B and 2 to 4B may be performed subsequently.

Figure 15:
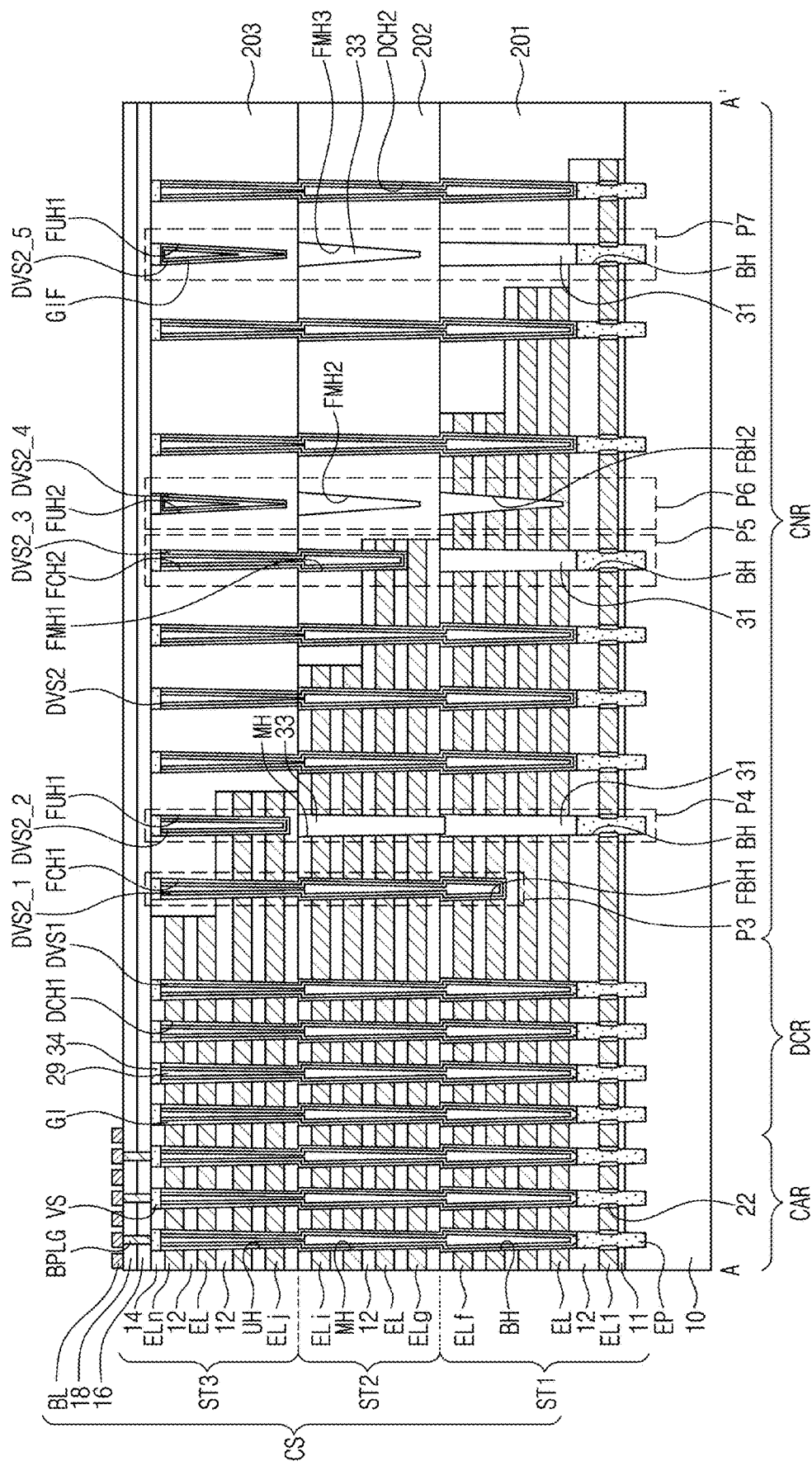
FIG. 15 illustrates a cross-sectional view taken along line A-A' of FIG. 2.

FIG. 15 illustrates a cross-sectional view taken along line A-A' of FIG. 2.

Referring to FIG. 15, the cell array structure CS may include a first sub-stack structure ST1, a second sub-stack structure ST2, and/or a third sub-stack structure ST3 that are sequentially stacked. The first sub-stack structure ST1 may include a buffer dielectric layer 11 on the substrate 10, and also include inter-electrode dielectric layers 12 and first to $f^{th}$ electrode layers EL1, EL, and ELf that are alternately stacked. The second sub-stack structure ST2 may include inter-electrode dielectric layers 12 and $g^{th}$ to $i^{th}$ electrode layers ELg, EL, and ELi that are alternately stacked. The third sub-stack structure ST3 may include inter-electrode dielectric layers 12 and $j^{th}$ to $n^{th}$ electrode layers ELj, EL, ELm, and ELn that are alternately stacked, and also include a capping dielectric layer 14. Here, f, g, i, j, m, and n are integers each greater than 2, wherein kg<i<j<m<n. The vertical hole CH, the central dummy vertical hole CDCH, the first dummy vertical hole DCH1, and the second dummy vertical hole DCH2 may each include a lower hole BH, a middle hole MH, and an upper hole UH that vertically overlap each other and are spatially connected to each other. The vertical hole CH, the central dummy vertical hole CDCH, the first dummy vertical hole DCH1, and/or the second dummy vertical hole DCH2 may have inner walls each of which has inflection points between the first sub-stack structure ST1 and the second sub-stack structure ST2 (or between the f$^{th}$ electrode layer ELf and the g$^{th}$ electrode layer ELg) and between the second sub-stack structure ST2 and the third sub-stack structure ST3 (or between the i$^{th}$ electrode layer ELi and the j$^{th}$ electrode layer ELj). The vertical patterns VS, CDVS, DVS1, and DVS2 may have sidewalls each of which has inflection points adjacent to locations between the first sub-stack structure ST1 and the second sub-stack structure ST2 and between the second sub-stack structure ST2 and the third sub-stack structure ST3.

The first sub-stack structure ST1 may have an end covered with a lower planarized dielectric layer 201. The lower planarized dielectric layer 201 may have a top surface coplanar with that of the first sub-stack structure ST1. A middle planarized dielectric layer 202 may cover the lower planarized dielectric layer 201 and an end of the second sub-stack structure ST2. The middle planarized dielectric layer 202 may have a top surface coplanar with that of the second sub-stack structure ST2. An upper planarized dielectric layer 203 may cover the middle planarized dielectric layer 202 and an end of the third sub-stack structure ST3. The upper planarized dielectric layer 203 may have a top surface coplanar with that of the third sub-stack structure ST3.

A first abnormal vertical hole FCH1 may be disposed at a third part P3 of the connection region CNR. The first abnormal vertical hole FCH1 may include an upper hole UH, a middle hole MH, and/or a first abnormal lower hole FBH1 spatially connected to the middle and upper holes MH and UH. The first abnormal lower hole FBH1 may not expose the substrate 10. The first abnormal vertical hole FCH1 may be formed in the upper planarized dielectric layer 203 and the first to third sub-stack structures ST1 to ST3, and three electrode layers EL1 and EL may be disposed below a bottom surface of the first abnormal lower hole FBH1. A first abnormal dummy vertical pattern DVS2_1 may be disposed in the first abnormal vertical hole FCH1. A sidewall of the first abnormal dummy vertical pattern DVS2_1 may have inflection points adjacent to locations between the first sub-stack structure ST1 and the second sub-stack structure ST2 and between the second sub-stack structure ST2 and the third sub-stack structure ST3.

A first abnormal upper hole FUH1 may be disposed at a fourth part P4 of the connection region CNR. The first abnormal upper hole FUH1 may not expose the second sub-stack structure ST2. The first abnormal upper hole FUH1 may be formed in the third sub-stack structure ST3. The first abnormal upper hole FUH1 may vertically overlap middle and lower holes MH and BH therebelow. The first abnormal upper hole FUH1 may be spaced apart from the middle hole MH therebelow. A semiconductor pattern EP and a sacrificial buried pattern 31 may be disposed in the lower hole BH. A middle sacrificial buried pattern 33 may be disposed in the middle hole MH. The lower sacrificial buried pattern 31 and the middle sacrificial buried pattern 33 may be in contact with each other. The middle sacrificial buried pattern 33 may include the same material as that of the lower sacrificial buried pattern 31. A second abnormal dummy vertical pattern DVS2_2 may be disposed in the first abnormal upper hole FUH1.

A second abnormal vertical hole FCH2 may be disposed at a fifth part P5 of the connection region CNR. The second abnormal vertical hole FCH2 may include an upper hole UH and an abnormal middle hole FMH1 spatially connected to the upper hole UH. The abnormal middle hole FMH1 may not expose and may be spaced apart from a lower hole BH therebelow. A third abnormal dummy vertical pattern DVS2_3 may be disposed in the second abnormal vertical hole FCH2.

A second abnormal upper hole FUH2 may be disposed at a sixth part P6 of the connection region CNR. The second abnormal upper hole FUH2 may be spaced apart from a second abnormal middle hole FMH2 therebelow. The second abnormal middle hole FMH2 may be spaced apart from a second abnormal lower hole FBH2 therebelow. A lower sacrificial buried pattern 31 may be disposed in the second abnormal lower hole FBH2, and a middle sacrificial buried pattern 33 may be disposed in the second abnormal middle hole FMH2.

A third abnormal upper hole FUH3 may be disposed at a seventh part P7 of the connection region CNR. The third abnormal upper hole FUH3 may be spaced apart from a third abnormal middle hole FMH3 therebelow. The third abnormal middle hole FMH3 may be spaced apart from a lower hole BH therebelow. A lower sacrificial buried pattern 31 may be disposed in the lower hole BH, and a middle sacrificial buried pattern 33 may be disposed in the third abnormal middle hole FMH3. Other configurations may be identical or similar to those discussed with reference to FIG. 11. A method of fabricating the three-dimensional semiconductor memory device of FIG. 15 may be identical or similar to that discussed with reference to FIGS. 12 to 14.

Figure 16:
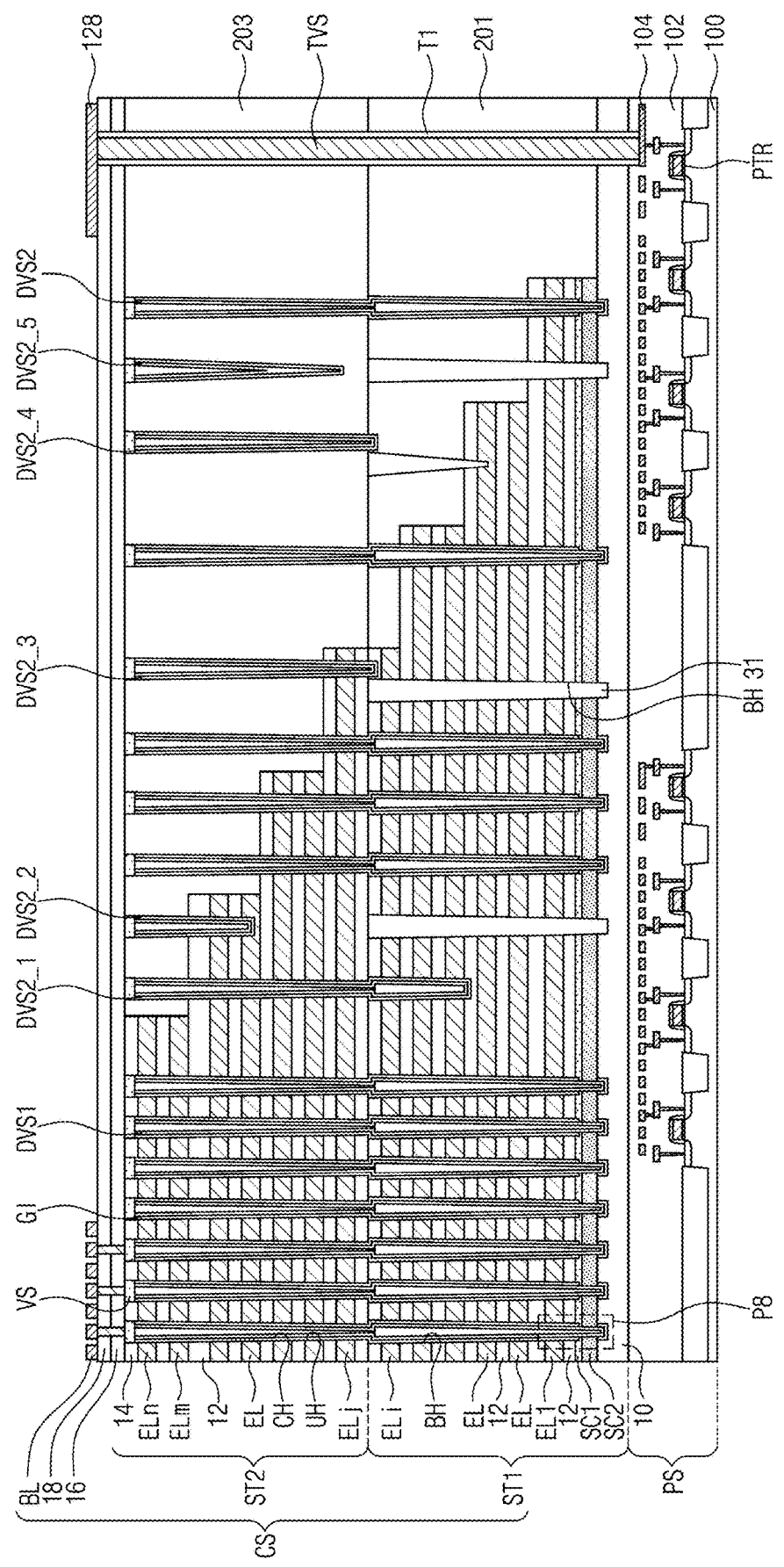
FIG. 16 illustrates a cross-sectional view taken along line A-A' of FIG. 2.
Figure 17:
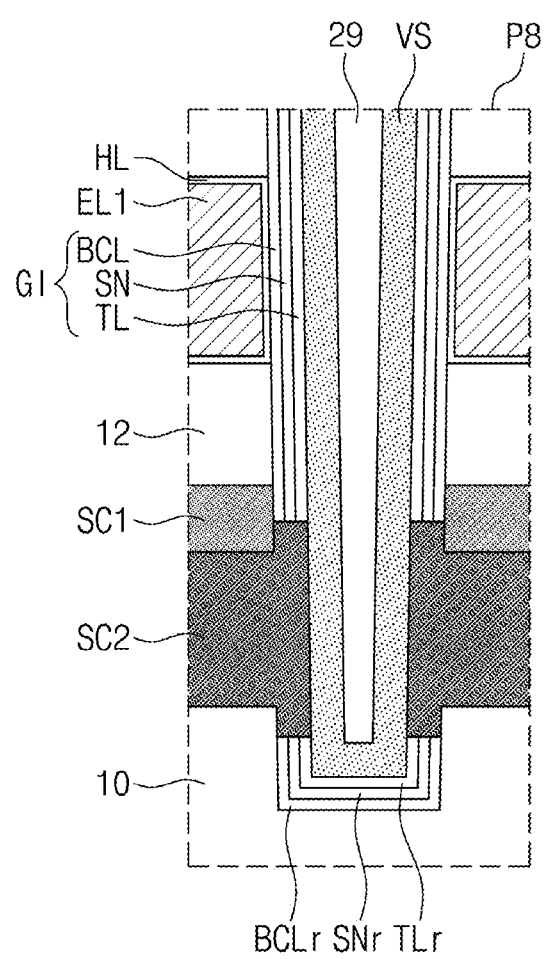
FIG. 17 illustrates an enlarged view showing section P8 of FIG. 16.

FIG. 16 illustrates a cross-sectional view taken along line A-A' of FIG. 2. FIG. 17 illustrates an enlarged view showing section P8 of FIG. 16.

Referring to FIGS. 16 and 17, the cell array structure CS may be stacked on a peripheral circuit structure PS. The peripheral circuit structure PS may include peripheral circuit transistors PTR disposed on a peripheral circuit substrate 100, a peripheral interlayer dielectric layer 102 that covers the peripheral circuit transistors PTR, and peripheral wiring lines 104 disposed in the peripheral interlayer dielectric layer 102.

The cell array structure CS may be configured similarly to FIG. 11, but may be different in that a first source pattern SC1 and a second source pattern SC2 are interposed between the first electrode layer EL1 and the substrate 10. The substrate 10 may be called a semiconductor layer. The inter-electrode dielectric layer 12 may be interposed between the first source pattern SC1 and the first electrode layer EL1. The first and second source patterns SC1 and SC2 may each include, for example, a polysilicon pattern or a single-crystalline silicon pattern doped with impurities having a first conductivity type. The second source pattern SC2 may penetrate the first gate dielectric layer GI, and may be coupled to the cell vertical patterns VS, the first dummy vertical patterns DVS2, and the second dummy vertical patterns DVS2. Residual tunnel dielectric layers TLr, residual charge storage layers SNr, and residual blocking dielectric layers BCLr may be interposed between the substrate 10 and the cell vertical patterns VS, between the substrate 10 and the first dummy vertical patterns DVS1, and between the substrate 10 and the second dummy vertical patterns DVS2. In the present example embodiments, the vertical patterns VS, CDVS, DVS1, DVS2, and DVS2_1 to DVS2_5 may be formed of a single or multiple semiconductor layers.

The abnormal dummy vertical patterns DVS2_1 to DVS2_5 may be spaced apart from the first source pattern SC1 and the second source pattern SC2. The lower sacrificial buried pattern 31 disposed in the lower hole BH may be in contact with the first source pattern SC1 and the second source pattern SC2.

The second interlayer dielectric layer 18 may be provided thereon with a connection line 128 spaced apart from the bit lines BL. The connection line 128 may be electrically connected to the peripheral wiring line 104 via a through electrode TVS that penetrates the upper planarized dielectric layer 203, the lower planarized dielectric layer 201, the substrate 10, and a portion of the peripheral interlayer dielectric layer 102. The through electrode TVS may have a sidewall surrounded by a through dielectric layer TI. Other configurations may be identical or similar to those discussed with reference to FIG. 11.

Figure 18:
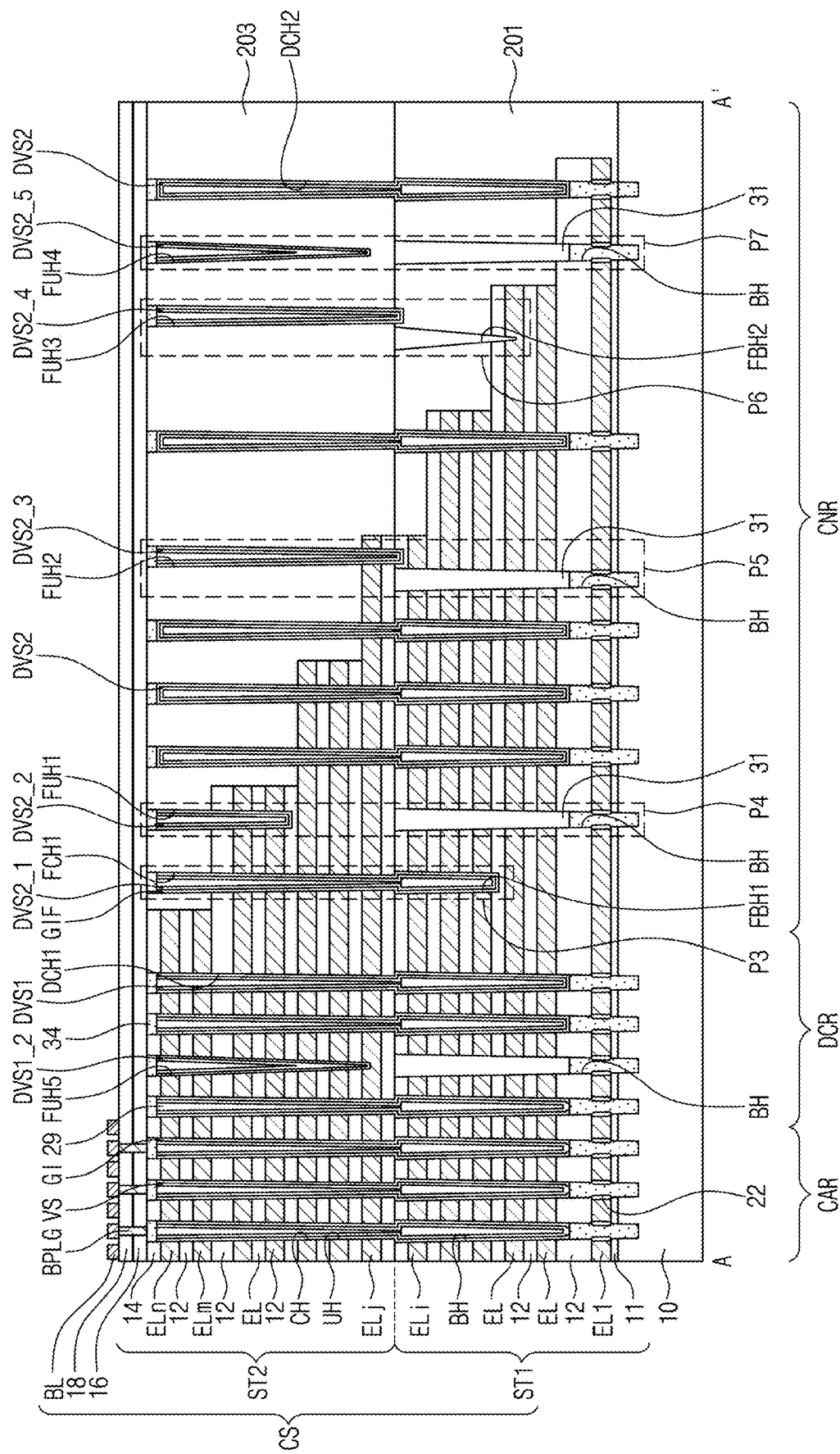
FIG. 18 illustrates a cross-sectional view taken along line A-A' of FIG. 2.

FIG. 18 illustrates a cross-sectional view taken along line A-A' of FIG. 2.

Referring to FIG. 18, a three-dimensional semiconductor memory device according to the present example embodiments may be configured to include a sixth abnormal dummy vertical pattern DVS1_2 on the dummy cell region DCR illustrated in FIG. 11. The sixth abnormal dummy vertical pattern DVS1_2 may be disposed in a fifth abnormal vertical hole FCH5. The fifth abnormal vertical hole FCH5 may be formed in a portion of the second stack structure ST2. The first stack structure ST1 may include a sacrificial buried pattern 31 that vertically overlaps and is spaced apart from the fifth abnormal vertical hole FCH5. In addition, as discussed with reference to FIG. 10, the first dummy vertical pattern DVS1 on the dummy cell region DCR may not be in contact with the semiconductor pattern EP. Other configurations may be identical or similar to those discussed with reference to FIGS. 10 and 11.

Figure 19:
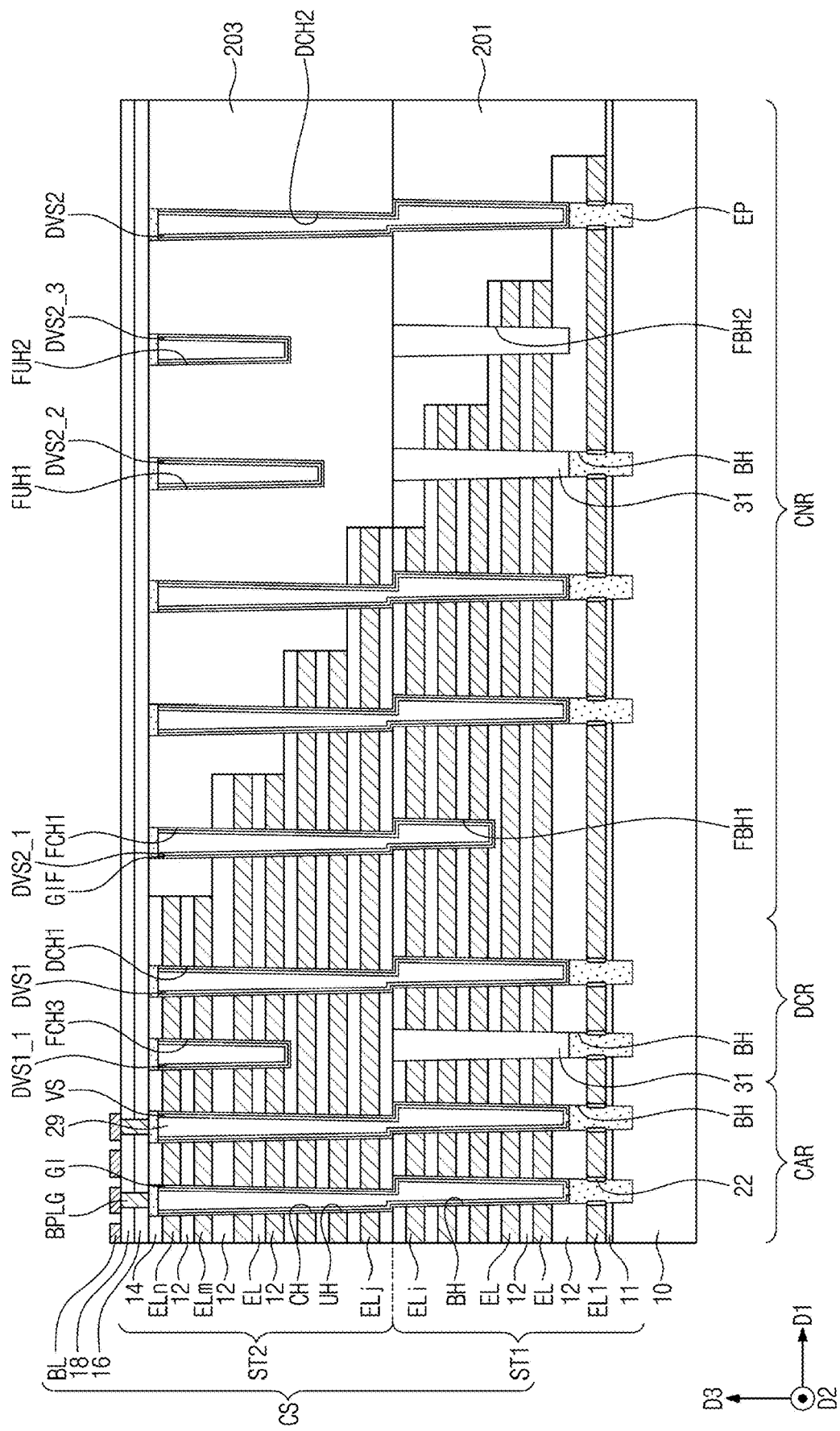
FIG. 19 illustrates a cross-sectional view showing a three-dimensional semiconductor memory device according to some example embodiments of the present inventive concepts.

FIG. 19 illustrates a cross-sectional view showing a three-dimensional semiconductor memory device according to some example embodiments of the present inventive concepts.

Referring to FIG. 19, a three-dimensional semiconductor memory device according to the present example embodiments may be configured such that the lower holes BH, FBH1, and/or FBH2 formed in the first sub-stack structure ST1 have centers spaced apart in the first direction D1 at a certain distance from centers of the upper holes UH, FUH1, FUH2, and FUH3 formed in the second sub-stack structure ST2. The vertical holes CH may then have sidewall profiles different from those illustrated in FIG. 18. Therefore, the vertical holes CH, DCH1, DCH2, and FCH1 may have sidewall profiles different from those illustrated in FIG. 18. In addition, the vertical patterns VS, CDVS, DVS1, DVS2, DVS2_1 and the gate dielectric layers GI and GIF may have sidewall profiles different from those illustrated in FIG. 18. For example, the upper holes UH may partially expose a top surface of the inter-electrode dielectric layer 12 positioned at top of the first sub-stack structure ST1. Therefore, in the vertical holes CH, DCH1, DCH2, and FCH1, the gate dielectric layers GI and GIF may be in contact with the top surface of the inter-electrode dielectric layer 12 positioned at top of the first sub-stack structure ST1. Other configurations may be identical or similar to those of FIG. 18.

A three-dimensional semiconductor memory device according to the present inventive concepts may be configured such that, on a connection region, abnormal dummy vertical patterns are electrically insulated from adjacent or underlying electrode layers through gate dielectric layers that surround bottom and lateral surfaces of the abnormal dummy vertical patterns. Accordingly, programming failure and/or current leakage may be reduced or prevented in the three-dimensional semiconductor memory device, and thus may increase reliability.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
    a substrate including a cell region and a connection region;
    a plurality of inter-electrode dielectric layers and a plurality of electrode layers alternately stacked on the substrate, ends of the plurality of electrode layers forming a stepwise shape on the connection region;
    a planarized dielectric layer on the connection region, the planarized dielectric layer covering the ends of the plurality of electrode layers; and
    a first abnormal dummy vertical pattern on the connection region, the first abnormal dummy vertical pattern penetrating the planarized dielectric layer in a first direction perpendicular to a top surface of the substrate,
    wherein at least one of the plurality of electrode layers is positioned between the first abnormal dummy vertical pattern and the substrate and is insulated from the first abnormal dummy vertical pattern.

2. The three-dimensional semiconductor memory device of claim 1, further comprising a second abnormal dummy vertical pattern on the connection region and spaced apart from the first abnormal dummy vertical pattern, the second abnormal dummy vertical pattern penetrating the planarized dielectric layer, one or more of the inter-electrode dielectric layers, and one or more of the plurality of electrode layers,
    wherein at least one of the plurality of electrode layers is positioned in the first direction between the second abnormal dummy vertical pattern and the substrate and is insulated from the second abnormal dummy vertical pattern, and
    wherein a first interval between the first abnormal dummy vertical pattern and the substrate is different from a second interval between the second abnormal dummy vertical pattern and the substrate.

3. The three-dimensional semiconductor memory device of claim 2, wherein the first abnormal dummy vertical pattern has a flat bottom surface, and
    the second abnormal dummy vertical pattern has an upper width and a lower width parallel a second direction, the second direction being parallel to the top surface of the substrate the lower width being about 85% or less of the upper width.

4. The three-dimensional semiconductor memory device of claim 1, further comprising a cell vertical pattern penetrating the inter-electrode dielectric layers and the plurality of electrode layers to be adjacent to the substrate on the cell region and,
    wherein the first abnormal dummy vertical pattern and the cell vertical pattern respectively have a first width and a second width at a same level in a second direction parallel to the top surface of the substrate, the first width being the same as or greater than the second width.

5. The three-dimensional semiconductor memory device of claim 4, further comprising:
a gate dielectric layer between the cell vertical pattern and the plurality of electrode layers; and
a semiconductor pattern between the substrate and the cell vertical pattern,
wherein the gate dielectric layer extends to cover at least a portion of a top surface of the semiconductor pattern, and
wherein the cell vertical pattern penetrates the gate dielectric layer and contacts the semiconductor pattern.

6. The three-dimensional semiconductor memory device of claim 1, wherein the substrate further includes a dummy cell region between the cell region and the connection region,
wherein the three-dimensional semiconductor memory device further comprises a first dummy vertical pattern penetrating the inter-electrode dielectric layers and the plurality of electrode layers to be adjacent to the substrate, the first dummy vertical pattern on the dummy cell region, wherein a bottom surface of the first dummy vertical pattern is closer to the substrate than a bottom surface of the first abnormal dummy vertical pattern.

7. The three-dimensional semiconductor memory device of claim 6, further comprising:
a cell vertical pattern penetrating the inter-electrode dielectric layers and the plurality of
electrode layers to be adjacent to the substrate on the cell region; and
a bit line electrically connected to the cell vertical pattern, wherein the bit line is electrically insulated from the first dummy vertical pattern.

8. The three-dimensional semiconductor memory device of claim 6, further comprising a second abnormal dummy vertical pattern on the dummy cell region and spaced apart from the first dummy vertical pattern, the second abnormal dummy vertical pattern penetrating one or more of the inter-electrode dielectric layers and one or more of the plurality of electrode layers,
wherein at least one of the plurality of electrode layers is positioned between the second abnormal dummy vertical pattern and the substrate and is insulated from the second abnormal dummy vertical pattern.

9. The three-dimensional semiconductor memory device of claim 1, wherein the first abnormal dummy vertical pattern has an upper width and a lower width parallel a second direction, the second direction being parallel to the top surface of the substrate, the lower width being about 35% to about 85% of the upper width.

10. The three-dimensional semiconductor memory device of claim 1, wherein the inter-electrode dielectric layers include:
a plurality of first inter-electrode dielectric layers adjacent to the substrate; and
a plurality of second inter-electrode dielectric layers on an uppermost one of the first inter-electrode dielectric layers,
wherein each of the plurality of electrode layers includes:
a plurality of first electrode layers respectively between the first inter-electrode dielectric layers; and
a plurality of second electrode layers respectively between the second inter-electrode dielectric layers, wherein the first inter-electrode dielectric layers and the plurality of first electrode layers constitute a first stack structure,
wherein the second inter-electrode dielectric layers and the plurality of second electrode layers constitute a second stack structure, and
wherein a sidewall of the first abnormal dummy vertical pattern has an inflection point between the first stack structure and the second stack structure.

11. The three-dimensional semiconductor memory device of claim 10, further comprising:
a second abnormal dummy vertical pattern on the connection region and spaced apart from the first stack structure and the first abnormal dummy vertical pattern, the second abnormal dummy vertical pattern penetrating the planarized dielectric layer, one or more of the second inter-electrode dielectric layers, and one or more of the plurality of second electrode layers; and
a sacrificial buried pattern in the first stack structure, the sacrificial buried pattern being spaced apart in the first direction from the second abnormal dummy vertical pattern.

12. The three-dimensional semiconductor memory device of claim 11, further comprising a semiconductor pattern in the first stack structure and between the sacrificial buried pattern and the substrate, the semiconductor pattern being in contact with both the sacrificial buried pattern and the substrate.

13. The three-dimensional semiconductor memory device of claim 11, wherein at least one of the plurality of first electrode layers is between the sacrificial buried pattern and the substrate.

14. The three-dimensional semiconductor memory device of claim 1, further comprising:
a cell vertical pattern penetrating the inter-electrode dielectric layers and the electrode layers to be adjacent to the substrate on the cell region; and
a source pattern between the substrate and a lowermost one of the inter-electrode dielectric layers,
wherein the source pattern is in contact with the cell vertical pattern and is spaced apart from the first abnormal dummy vertical pattern.

15. The three-dimensional semiconductor memory device of claim 1, further comprising:
a cell vertical pattern penetrating the inter-electrode dielectric layers and the plurality of electrode layers to be adjacent to the substrate on the cell region; and
a peripheral circuit structure below the first abnormal dummy vertical pattern, the peripheral circuit structure including a transistor and a peripheral wiring line.

16. A three-dimensional semiconductor memory device, comprising:
a substrate including a cell region and a connection region;
a first stack structure including a plurality of first inter-electrode dielectric layers and a plurality of first electrode layers alternately stacked on the substrate;
a second stack structure including a plurality of second inter-electrode dielectric layers and a plurality of second electrode layers alternately stacked on the first stack structure;
a cell vertical pattern on the cell region, the cell vertical pattern penetrating the first and second stack structures in a first direction perpendicular to a top surface of the substrate; and an abnormal dummy vertical pattern on the connection region, the abnormal dummy vertical pattern penetrating one or more of the plurality of second electrode layers, wherein a sidewall of the cell vertical pattern has an inflection point adjacent to a boundary between the first stack structure and the second stack structure, and wherein at least one of the first plurality of electrode layers is between the abnormal dummy vertical pattern and the substrate in the first direction.

17. The three-dimensional semiconductor memory device of claim 12, wherein the abnormal dummy vertical pattern extends into the first stack structure, and a sidewall of the abnormal dummy vertical pattern has an inflection point adjacent to a boundary between the first stack structure and the second stack structure.

18. The three-dimensional semiconductor memory device of claim 16, wherein the abnormal dummy vertical pattern is spaced apart from the first stack structure, p1 wherein the three-dimensional semiconductor memory device further comprises a sacrificial buried pattern in the first stack structure and adjacent to the abnormal dummy vertical pattern in the first direction.

19. The three-dimensional semiconductor memory device of claim 16, further comprising a source pattern between the substrate and a lowermost one of the first inter-electrode dielectric layers, wherein the source pattern is in contact with the cell vertical pattern and is spaced apart from the abnormal dummy vertical pattern.

20. A three-dimensional semiconductor memory device, comprising:

a peripheral circuit structure including a transistor and a peripheral wiring line; and a cell array structure on the peripheral circuit structure, wherein the cell array structure includes:

a first substrate including a cell region and a connection region;

a first stack structure including a plurality of first inter-electrode dielectric layers and a plurality of first electrode layers alternately stacked on the first substrate;

a second stack structure including a plurality of second inter-electrode dielectric layers and a plurality of second electrode layers alternately stacked on the first stack structure;

an abnormal dummy vertical pattern on the connection region, the abnormal dummy vertical pattern penetrating one or more of the plurality of second electrode layers in a first direction perpendicular to a top surface of the substrate; and a sacrificial buried pattern in the first stack structure on the connection region, the sacrificial buried pattern being spaced apart from the abnormal dummy vertical pattern.

* * * * *